United States Patent [19]
Tamamura et al.

[11] Patent Number: 6,118,316
[45] Date of Patent: *Sep. 12, 2000

[54] SEMICONDUCTOR INTEGRATED CIRCUIT INCLUDING PLURALITY OF PHASE-LOCKED LOOPS

[75] Inventors: Masaya Tamamura; Syouji Ohishi, both of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/749,672

[22] Filed: Nov. 15, 1996

[30] Foreign Application Priority Data

May 8, 1996 [JP] Japan .................................. 8-113986

[51] Int. Cl.⁷ ............................. H03L 7/085; H03L 7/093
[52] U.S. Cl. ................................ 327/156; 327/158; 331/2
[58] Field of Search ..................................... 327/159, 158, 327/157, 156, 107, 147, 148, 149, 150; 331/2, 10, 11; 375/376

[56] References Cited

U.S. PATENT DOCUMENTS

| | | | |
|---|---|---|---|
| 4,612,517 | 9/1986 | Wagner | 331/2 |
| 4,806,879 | 2/1989 | Troxel | 331/2 |
| 5,028,887 | 7/1991 | Gilmore | 327/107 |
| 5,131,031 | 7/1992 | Waldman | 379/393 |
| 5,144,254 | 9/1992 | Wilke | 331/2 |
| 5,343,167 | 8/1994 | Masumoto et al. | 331/2 |
| 5,347,365 | 9/1994 | Harigai et al. | 331/11 |
| 5,399,995 | 3/1995 | Kardontchik et al. | 331/17 |
| 5,414,390 | 5/1995 | Kovacs et al. | 331/2 |
| 5,477,193 | 12/1995 | Burchfield | 331/8 |
| 5,586,308 | 12/1996 | Hawkins et al. | 395/556 |
| 5,710,524 | 1/1998 | Chou et al. | 327/107 |
| 5,745,011 | 4/1998 | Scott | 331/14 |
| 5,757,239 | 5/1998 | Gilmore | 327/107 |
| 5,828,678 | 10/1998 | Mock | 371/62 |

FOREIGN PATENT DOCUMENTS

| | | | |
|---|---|---|---|
| 0 493 607 | 7/1992 | European Pat. Off. | H03L 7/18 |
| 0 663 744 | 7/1995 | European Pat. Off. | H04L 7/00 |
| 58-170229 | 10/1983 | Japan | H03L 7/22 |
| 02021725 | 1/1990 | Japan | H03L 7/14 |
| 02162832 | 6/1990 | Japan | H03L 7/095 |
| 02203622 | 8/1990 | Japan | H03L 7/107 |
| 04138722 | 5/1992 | Japan | H03L 7/22 |
| 7-131492 | 5/1995 | Japan | H04L 25/52 |
| 93/25023 | 12/1993 | WIPO | H04L 7/033 |

OTHER PUBLICATIONS

Ryutaro Horita et al, A 32MB/S Disk Drive Data Separator for Constant Density Recording, Proceedings of the Custom Inegrated Circuits Conference, San Diego, CA, May 12–15, 1991, no. Conf. 13, May 12, 1991, pp. 9.6.1–9.6.4.

Junichio Goto et al, A Programmable Clock Generator with 50 to 350 MHZ Lock Range for Video Signal Processors, Proceedings of the Custom/Integrated Circuits Conference, San Diego, CA, May 9–12, 1993, no. conf. 15, May 9, 1993, pp. 4.4.1–4.4.4.

Pottbäcker A. et al, An 8 GHZ Silicon Bipolar Clock–Recovery and Data–Regenerator IC, IEEE Journal of Solid–State Circuits, vol. 29, No. 12, Dec. 1, 1994, pp. 1572–1576.

Sam Yinshang Sun, A High Speed High Jitter Tolerant Clock and Data Recovery Circuit Using Crystal Based Dual PLL, Proceedings of the Bipolar Circuits and Technology Meeting, Minneapolis, MN, Sep. 9–10, 1991, Sep. 9, 1991, pp. 293–296.

*Primary Examiner*—Timothy P. Callahan
*Assistant Examiner*—Terry L. Englund
*Attorney, Agent, or Firm*—Staas & Halsey LLP

[57] ABSTRACT

A semiconductor integrated circuit generating a stabilized oscillation signal based on an input signal includes a plurality of unit circuits connected in series, each of the unit circuits having at least an oscillator, a divider, and a phase comparator which construct at least one part of a phase-locked loop. In the unit circuit, a frequency of an oscillation output signal of a latter one of the unit circuits is higher than that of an oscillation output signal of a former one of the unit circuits.

6 Claims, 20 Drawing Sheets

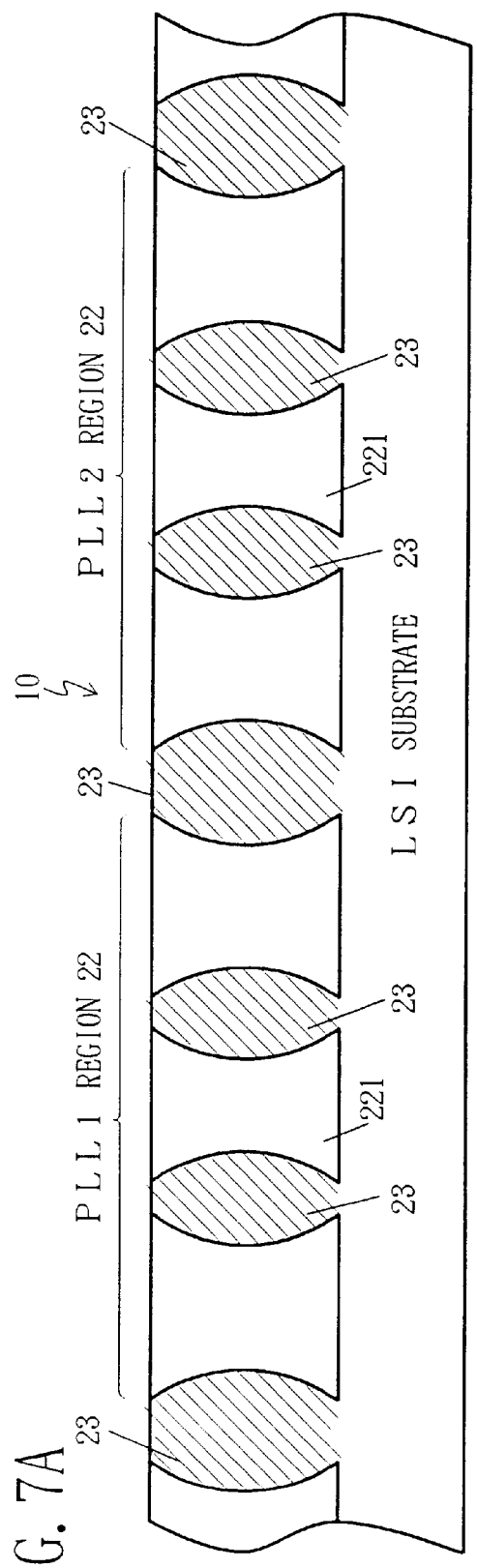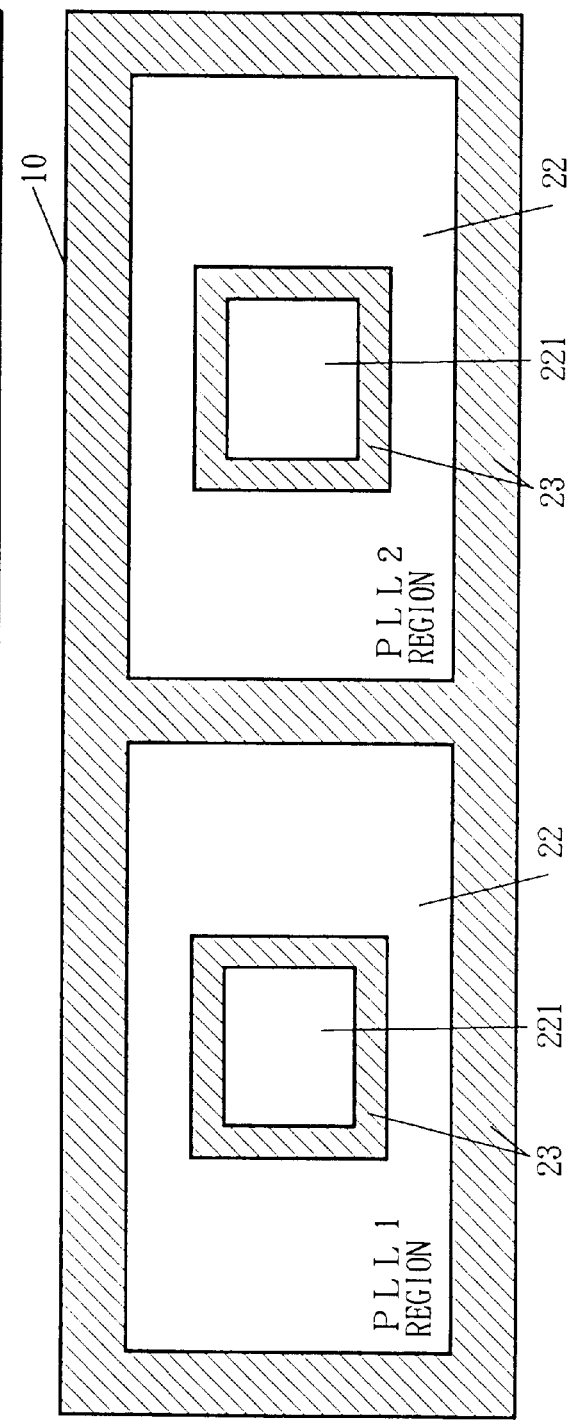

SEMICONDUCTOR INTEGRATED CIRCUIT INCLUDING PLURALITY OF PHASE-LOCKED LOOPS

BACKGROUND OF THE INVENTION

1. Field of the Invention

The present invention generally relates to a semiconductor integrated circuit operable as a phase-locked loop, and more particularly, to a semiconductor integrated circuit operable as a phase-locked loop which generates an extremely stable high-frequency oscillation signal.

The present invention is also directed to a semiconductor integrated circuit operable as a clock recovery circuit using a phase-locked loop.

2. Description of the Related Art

FIG. 1 shows a first configuration example of a prior art semiconductor integrated circuit using a phase-locked loop (PLL). A semiconductor integrated circuit 9A is constructed with an oscillator 3, a divider 4, a phase comparator (also referred to as a phase detector) 1, and a loop filter 2.

The oscillator 3 generates an oscillation output signal 3a whose frequency is n times a frequency of input data 1b and is controlled by an oscillation-frequency control signal 2a. In the divider 4, the frequency of the oscillation output signal 3a is divided by n (n is a division ratio, n=1, 2, 3 . . . ) to produce a divided signal 4a.

The phase comparator 1 compares the frequency of the divided signal 4a with the frequency of the input data 1b, and outputs a phase comparison signal 1a according to a difference of their frequencies. The loop filter 2 integrates the phase comparison signal 1a and converts it into the oscillation-frequency control signal 2a.

In this way, in the PLL circuit used in the semiconductor integrated circuit 9A, a feedback loop, in which the oscillation output signal 3a is fed back to the phase comparator 1 through the divider 4, is formed.

FIG. 2 shows a second configuration example of the prior art semiconductor integrated circuit using the PLL. FIG. 3 shows a timing chart of the second configuration example of the prior art semiconductor integrated circuit shown in FIG. 2. In a semiconductor integrated circuit 9C shown in FIG. 2, in addition to the PLL circuit of the semiconductor integrated circuit 9A, a retiming block 9B is provided, and thus, the semiconductor integrated circuit 9C may be operative as a timing (clock) recovery circuit. The retiming block 9B generates retiming data 6a from the input data 1b based on the oscillation output signal 3a (recovered clock) of the oscillator 3.

The retiming block 9B is constructed with a pulse generating circuit 5, a retiming circuit 6, and a delay circuit 7. As shown in FIG. 3, the pulse generating circuit 5 detects a transition timing (an edge) of the input data 1b, and generates a detected pulse signal 5a so as to be triggered by the transition timing. The delay circuit 7 delays the oscillation output signal 3a of the oscillator 3 and transits delayed data 7a to the retiming circuit 6. The retiming circuit 6 operates a retiming operation, and generates the retiming data 6a from the input data 1b based on the delayed data 7a.

The PLL circuit is provided as a feedback loop between the pulse generating circuit 5 and the delay circuit 7, and is operative so that the pulse edge of the oscillation output signal 3a is positioned in a center of one pulse of the detected pulse signal 5a.

However, there are the following problems in the above-discussed prior art semiconductor integrated circuits 9A, 9C.

In the semiconductor integrated circuit 9A shown in FIG. 1, when the high-frequency oscillation output signal 3a is generated by multiplying the low-frequency input data 1b, and when the multiplication ratio (equal to the division ratio n) is large, the PLL operation becomes unstable. As a result, there is a problem in that it is difficult to generate the oscillation output signal 3a having an extremely stable frequency for a large division ratio.

For example, when the frequencies of the oscillation output signal 3a and the input data 1b are respectively 100 MHz and 1 MHz (namely, the division ratio is 100), only one pulse of the input data 1b is supplied to the phase comparator 1 during the time the oscillator 3 operates so as to generate 100 pulses.

Therefore, a sufficient number of phase comparing operations between the input data 1b and the oscillation output signal 3a are not carried out, and, thus, the PLL operation becomes unstable. As a result, a frequency shift may occur between the frequency of the oscillation output signal 3a and a desired frequency obtained by multiplying the frequency of the input data 1b by the division ratio n. Thus, a high stability of the oscillation output signal 3a may not be obtained.

On the other hand, in the semiconductor integrated circuit 9C shown in FIG. 2, the input data 1b is not a regular alternating signal, and changes substantially at random such as a demodulated signal. Therefore, a degree of the oscillator frequency control signal transmitted to the oscillator 3 decreases as compared to the conventional PLL circuit (successive data is provided to the phase comparator 1 as the reference signal). Accordingly, there is a problem in that an operation of the PLL circuit in the timing recovery circuit becomes unstable, and an error may occur in the retiming data 6a.

Further, in the retiming block 9B, the delay circuit 7 delays the oscillation output signal 3a so that the pulse edge of the oscillation output signal 3a is positioned in the center of one pulse of the detected pulse signal 5a. However, the delay time by the delay circuit 7 may easily be influenced from an outside temperature, fluctuation of an operation power source, manufacture dispersion, etc. As a result, there is a problem in that an error may occur in the retiming data 6a.

SUMMARY OF THE INVENTION

It is an object of the present invention to provide a semiconductor integrated circuit operable as a phase-locked loop (PLL). In the semiconductor integrated circuit, even if, in the PLL, a large division ratio is required for generating a high-frequency oscillation output signal based on low-frequency input data, an extremely stable high-frequency oscillation output signal may be generated.

It is another object of this invention to provide a semiconductor integrated circuit operable as a clock recovery circuit using a PLL. In the semiconductor integrated circuit, a stable operation in the clock recovery circuit may be achieved for input data changing at random.

Further, the clock recovery circuit is prevented from being influenced from outside temperature, fluctuation of an operation power source, manufacture dispersion, etc. Therefore, pulse edges of an oscillation output signal of the PLL may be precisely positioned in substantially the center of one data pulse of a detected pulse signal produced based on input data. As a result, retiming data may be generated without causing an error.

This permits the disadvantages described above to be eliminated.

The objects described above are achieved by a semiconductor integrated circuit generating a stabilized oscillation signal based on an input signal, the circuit comprising: a plurality of unit circuits connected in series, each of the unit circuits having at least an oscillator, a divider, and a phase comparator which is constructed of at least one part of a phase-locked loop: wherein a frequency of an oscillation output signal of a latter one of the unit circuits is higher than that of an oscillation output signal of a former one of the unit circuits.

The objects described above are also achieved by the semiconductor integrated circuit mentioned above, wherein each of the unit circuits comprises a loop filter, and a loop filter provided in the latter one of the unit circuits generates an oscillation-frequency control signal higher than that generated from a loop filter provided in the former one of the unit circuits.

The objects described above are also achieved by the semiconductor integrated circuit mentioned above, wherein the oscillator provided in the latter one of the unit circuits has a variable frequency range larger than that of the oscillator provided in the former one of the unit circuits.

According to one of the above-discussed semiconductor integrated circuits, even if a large total multiplication ratio (division ratio) is required for generating the stabilized oscillation signal based on the input signal in the semiconductor integrated circuit using the PLL, by providing a plurality of unit circuits (PLLs) connected in series, the large total multiplication ratio may be divided into a plurality of small division ratios in the PLLs. Accordingly, the control information to be provided to the oscillator increases, and, thus, an extremely stable high-frequency oscillation output signal may be produced.

The objects described above are also achieved by the semiconductor integrated circuit mentioned above, further comprising isolating regions for electrically isolating the unit circuits from each other.

According to the above-discussed semiconductor integrated circuit, between regions of the PLLs, the isolating regions are provided for electrically isolating the PLLs from each other. Therefore, electromagnetic interruption caused by the oscillators of the PLLs may be reduced. As a result, in the semiconductor integrated circuit, a further stable high-frequency oscillation output signal may be generated.

The objects described above are also achieved by the semiconductor integrated circuit mentioned above, further comprising a dedicated power source for each of the unit circuits.

According to the above-discussed semiconductor integrated circuit, the power sources are individually provided. Therefore, the electromagnetic interruption caused by the oscillators of the PLLs may be reduced. As a result, in the semiconductor integrated circuit, a further stable high-frequency oscillation output signal may be generated.

The objects described above are also achieved by the semiconductor integrated circuit mentioned above, wherein at least one of the unit circuits comprises: at least one of a differential output circuit and a differential receive circuit; wherein: the differential output circuit couples with an output part of the oscillator, and converts the oscillation output signal of the oscillator into a differential oscillation output signal to be transmitted to the latter one of the unit circuits; and the differential receive circuit couples with an input part of the phase comparator, receives the differential oscillation output signal transmitted from the differential output circuit provided in the former one of the unit circuits, and converts the differential oscillation output signal into an input signal of the phase comparator.

According to the above-discussed semiconductor integrated circuit, a differential transmission is used between the unit circuits. Therefore, the electromagnetic interruption caused in the unit circuits may be reduced, and a mismatch of signal levels between the unit circuits may be prevented. As a result, in the semiconductor integrated circuit, a further stable high-frequency oscillation output signal may be generated.

The objects described above are also achieved by the semiconductor integrated circuit mentioned above, wherein the divider provided in at least one of the unit circuits comprises a division ratio less than a ratio of the frequency of the oscillation output signal to a frequency of an input signal of the phase comparator.

According to the above-discussed semiconductor integrated circuit, the division ratio n of the divider is set to be less than a conventional value. Therefore, degradation of the control range in the phase comparator may be reduced. Accordingly, even if a large multiplication ratio is required to generate the stabilized output signal in the semiconductor integrated circuit using the PLL circuit, an extremely stable high-frequency oscillation signal may be obtained from the semiconductor integrated circuit.

The objects described above are also achieved by a semiconductor integrated circuit including a unit circuit which forms at least one part of a phase-locked loop and operates as a clock recovery circuit to generate a synchronized oscillation signal based on input data, and a retiming part which generates recovery data by the oscillation output signal from the input data, the unit circuit comprising: an oscillator generating an oscillation output signal whose oscillation frequency is changed to substantially $M \times (m/n)$ when a transmission rate of the input data is changed to $M \times (m/n)$, where M is a given frequency, and m, n are 1, 2, 3 . . . ; and a phase comparator; wherein the oscillation output signal generated in the oscillator is provided to the phase comparator without passing through a divider and is directly compared with the input data.

According to the above-discussed semiconductor integrated circuit, the oscillation output signal is fed back to the phase comparator without passing through the divider, and is always directly compared with the input data. Therefore, a degree of control information produced from the phase comparator may be increased as compared to the conventional PLL including the divider and the oscillator generating only one frequency band. As a result, an error is prevented from being caused in the retiming (recovery) data.

The objects described above are also achieved by the semiconductor integrated circuit mentioned above, wherein the oscillator comprises: a multivibrator for generating the oscillation output signal whose frequency is determined by a current flowing through the multivibrator; and current switches coupling to the multivibrator and controlling the current flowing through the multivibrator, the current switches respectively having current sources; wherein by controlling the current switches to add currents of the current sources to the current flowing through the multivibrator, the oscillation frequency of the oscillation output signal of the oscillator is changed to substantially $M \times (m/n)$.

According to the above-discussed semiconductor integrated circuit, the oscillator is constructed with the multivibrator and the current switches. Therefore, the oscillation frequency of the oscillation output signal of the oscillator may be easily changed to substantially M×(m/n). As a result, a stable PLL operation in the clock recovery circuit may be carried out, and errorless recovery data may be generated.

The objects described above are also achieved by the semiconductor integrated circuit mentioned above, wherein the oscillator comprises: a ring oscillator including a plurality of gate circuits connected in series in a ring; and at least one switch circuit for changing the number of the gate circuits in the ring; wherein by controlling the switch circuits to change the number of the gate circuits in the ring, the oscillation frequency of the oscillation output signal of the oscillator is changed to substantially M×(m/n).

According to the above-discussed semiconductor integrated circuit, the oscillator is constructed with a plurality of gate circuits and at least one switch circuit. Therefore, the oscillation frequency of the oscillation output signal of the oscillator may be easily changed to substantially M×(m/n). As a result, a stable PLL operation in the clock recovery circuit may be carried out, and errorless recovery data may be generated.

The objects described above are also achieved by a semiconductor integrated circuit including a unit circuit which constructs at least one part of a phase-locked loop and operates as a clock recovery circuit to generate an oscillation output signal based on input data, and a retiming part which generates recovery data by the oscillation output signal from the input data, the unit circuit comprising: an oscillator generating the oscillation output signal whose oscillation frequency band is substantially fixed to M even when a transmission rate of the input data is changed to M×(m/n), where M is a given frequency, and m, n are 1, 2, 3 . . . ; and a phase comparator; wherein the oscillation output signal generated in the oscillator is provided to the phase comparator without passing through a divider and is directly compared with the input data.

According to the above-discussed semiconductor integrated circuit, the oscillation output signal of the oscillator is directly fed back to the phase comparator without passing through the divider. Therefore, a loop gain in the PLL circuit is prevented from being degraded. As a result, a stable PLL operation in the clock recovery circuit may be carried out, and errorless recovery data may be generated from the semiconductor integrated circuit.

The objects described above are also achieved by a semiconductor integrated circuit including a unit circuit which constructs at least one part of a phase-locked loop and operates as a clock recovery circuit to generate a synchronized oscillation signal based on input data, and a retiming part which generates recovery data by the oscillation output signal from the input data, the retiming part comprising: a pulse generating circuit detecting level transition of the input data and generating a detected pulse having a pulse width δt to be provided to the unit circuit; a delay circuit delaying the input data by a given delay time determined based on the pulse width δt in order to produce delayed data; and a retiming circuit carrying out a retiming operation for the delayed data by one of a leading edge and a trailing edge of the synchronized oscillation signal in order to generate the recovery data.

According to the above-discussed semiconductor integrated circuit, the delay circuit is provided between the input data and the retiming circuit. Therefore, when the given delay time in the delay circuit is changed due to an outside temperature, fluctuation of an operation power source, dispersion due to manufacture, etc., in the same way, the pulse width δt of the detected pulse is also changed. Since the oscillation output signal is synchronized with the detected pulse, even if the given delay time in the delay circuit changes, a stable retiming operation may be carried out. As a result, errorless recovery data may be generated.

The objects described above are also achieved by the semiconductor integrated circuit mentioned above, wherein the unit circuit substantially comprises a phase-locked loop operating so that one of the leading edge and the trailing edge of the synchronized oscillation signal is adjusted to substantially the center of the pulse width δt of the detected pulse, and the given delay time of the delay circuit is set to be substantially δt/2, whereby one of the leading edge and the trailing edge of the synchronized oscillation signal is adjusted to substantially the center of one data pulse width of the delayed data.

According to the above-discussed semiconductor integrated circuit, the PLL circuit is constructed so that the leading edge or the trailing edge of the oscillation output signal 203a is adjusted to substantially the center of the pulse width δt of the detected pulse. Therefore, even if the delay time δt/2 in the delay circuit is changed, the leading edge or the trailing edge of the oscillation output signal may be always positioned at substantially the center of the one data pulse of the input data. As a result, the clock recovery circuit in the semiconductor integrated circuit is prevented from being influenced from an outside temperature, fluctuation of an operation power source, dispersion due to manufacture, etc., and errorless recovery data may be generated.

The objects described above are also achieved by the semiconductor integrated circuit mentioned above, wherein the pulse generating circuit and the delay circuit construct a combination circuit, the combination circuit comprising a first delay circuit delaying the input data by the given delay time δt/2, a second delay circuit delaying an output of the first delay circuit by the given delay time δt/2, and a logically synthesizing circuit synthesizing the input data and delayed data transmitted through the first delay circuit and the second delay circuit so as to generate the detected pulse having the pulse width δt; and the delayed data of the delay circuit is derived from the output of the first delay circuit.

According to the above-discussed semiconductor integrated circuit, the pulse generating circuit and the delay circuit in the retiming part may be easily constructed as the simplified combination circuit. Therefore, the clock recovery circuit of the semiconductor integrated circuit may be simplified.

The objects described above are also achieved by the semiconductor integrated circuit mentioned above, wherein the phase-locked loop comprises a differential ring oscillator.

According to the above-discussed semiconductor integrated circuit, the oscillator in the PLL is constructed with a differential ring oscillator. Therefore, regardless of outside temperature, fluctuation of an operation power source, dispersion due to manufacture, etc., a proper duty ratio of the oscillator may be obtained in the PLL clock recovery circuit of the semiconductor integrated circuit 30, and, thus, errorless recovery data may be generated.

Other objects and further features of the present invention will be apparent from the following detailed description when read in conjunction with the accompanying drawings.

BRIEF DESCRIPTION OF THE DRAWINGS

FIG. 5A shows the relationship being in practical use in the semiconductor integrated circuit according to the present invention;

FIG. 7A shows a cross-sectional view of a modification of the semiconductor integrated circuit shown in FIG. 6A, in which an oscillator is further isolated;

FIG. 7B shows a top plan view of the modification of the semiconductor integrated circuit shown in FIG. 7A;

DETAILED DESCRIPTION OF THE PREFERRED EMBODIMENTS

In the following descriptions, the term "phase-locked loop (PLL)" is used. The PLL commonly is constructed with a voltage controlled oscillator (VCO), a divider, a phase comparator (phase detector), and a loop filter, and may be formed by a single IC (PLL-IC). The VCO commonly includes a resonator element, the divider commonly includes a prescaler, and the loop filter commonly includes a large value capacitor. In practical use, the resonator element, the prescaler, and the capacitor may be provided externally of the PLL-IC. Particularly, when a frequency of the oscillator increases to a high radio frequency, the entire oscillator may be provided externally of the PLL-IC.

However, in the present invention, it should be noted that the term "PLL" indicates not only a normal PLL including the resonator element, the prescaler, and the capacitor, but also a PLL having interfaces for connecting externally provided components such as the resonator element, the prescaler, and the capacitor. Therefore, in the specification, in one case, the term "PLL" may be referred to as "a unit circuit".

In this specification, two types of semiconductor integrated circuits using the PLL according to the present invention will be described.

(1) First-type semiconductor integrated circuit

Figure 4:
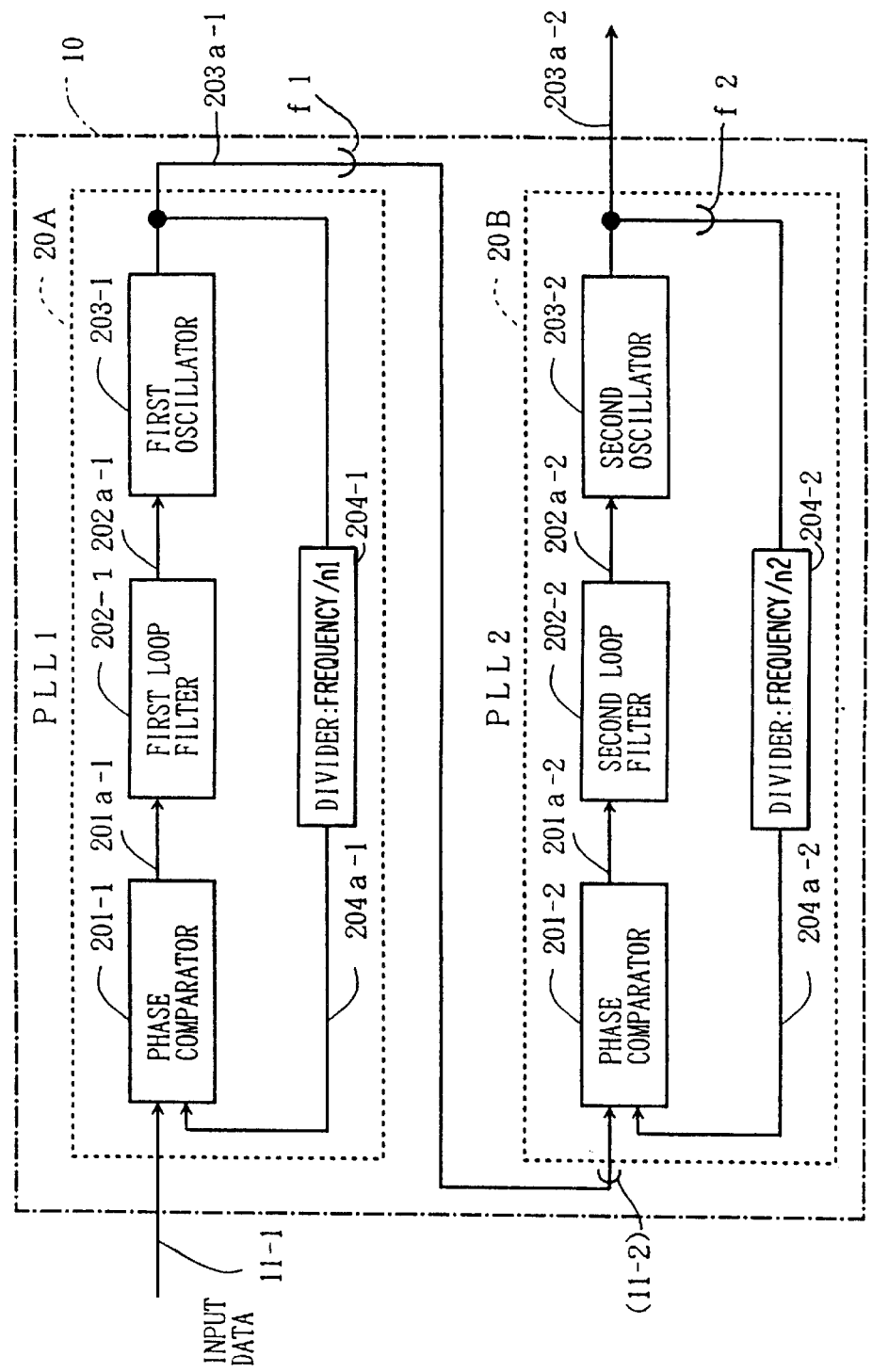
FIG. 4 shows a block diagram of a first embodiment of a first-type semiconductor integrated circuit using a plurality of PLLs according to the present invention.
Figure 5A:
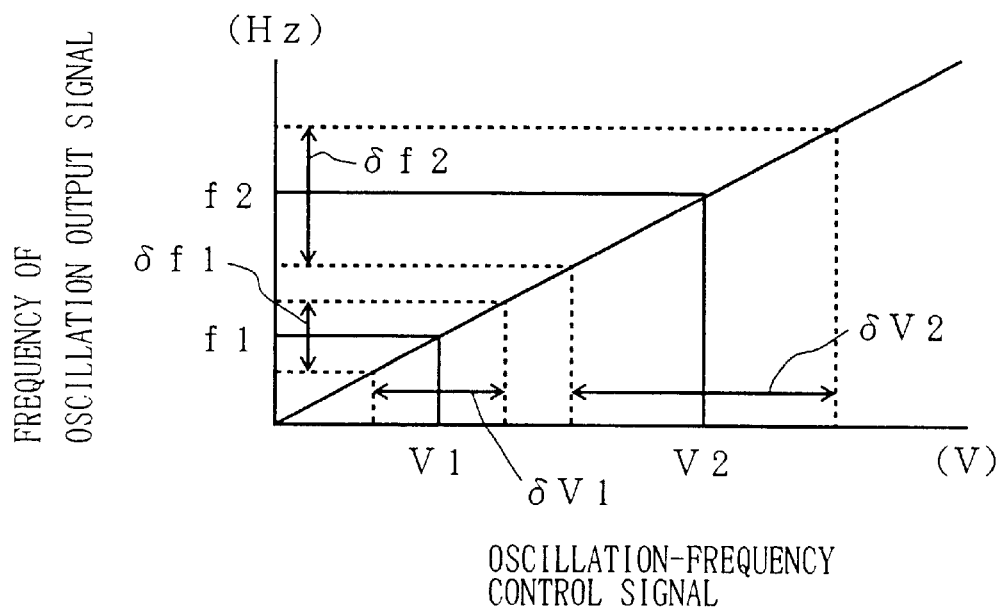
FIG. 5A and FIG. 5B show graphs for explaining a relationship of a control range of an oscillation-frequency control signal and a frequency variable range of an oscillation output signal in the semiconductor integrated circuit shown in FIG. 4.
Figure 5B:
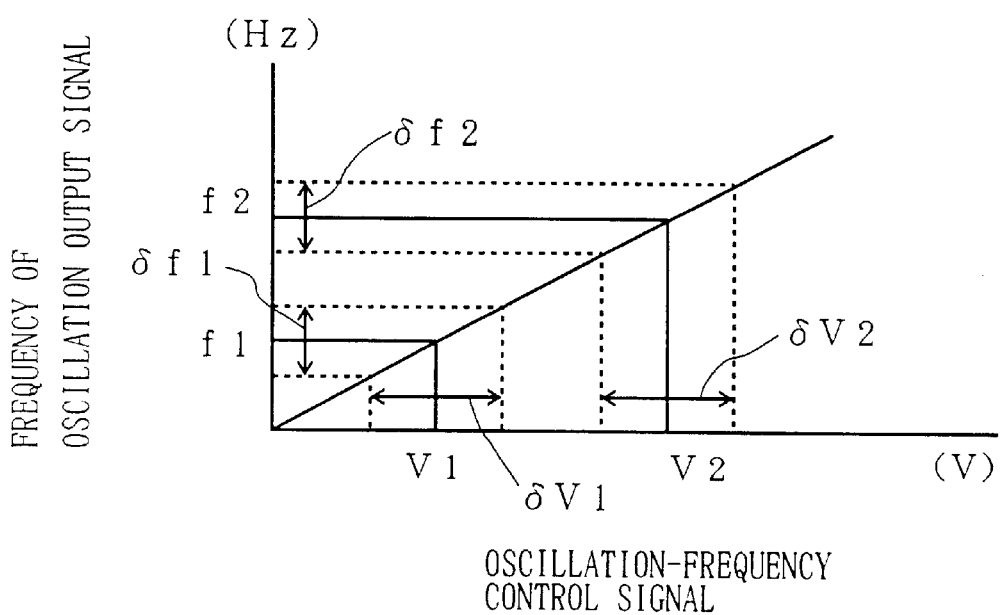

First, a description will be given of a first embodiment of a first-type semiconductor integrated circuit using a plurality of phase locked loops (PLLs) according to the present invention, by referring to FIG. 4 through FIG. 7B. FIG. 4 shows a block diagram of the first embodiment of the first-type semiconductor integrated circuit using a plurality of PLLs according to the present invention. FIG. 5A and FIG. 5B show graphs for explaining a relationship of a control range of an oscillation-frequency control signal $202a$ and a frequency variable range of an oscillation output signal $203a$ in the semiconductor integrated circuit shown in FIG. 4. FIG. 5A shows the relationship being in practical use in the semiconductor integrated circuit according to the present invention.

Figure 6A:
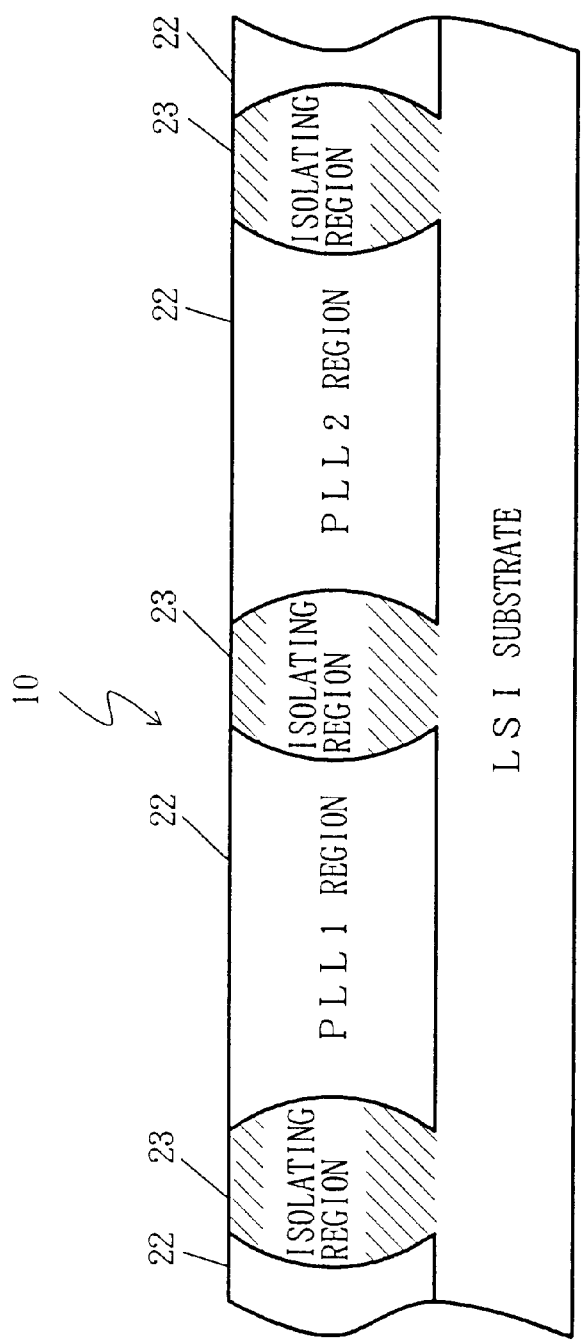
FIG. 6A shows a cross-sectional view of the semiconductor integrated circuit shown in FIG. 4 for explaining isolating means.
Figure 6B:
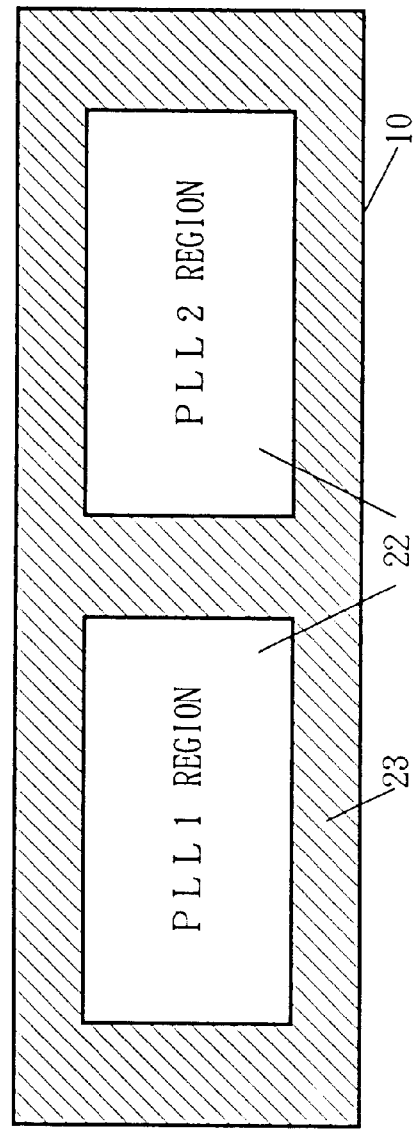
FIG. 6B shows a top plan view of the semiconductor integrated circuit shown in FIG. 6A.

FIG. 6A shows a cross-sectional view of the semiconductor integrated circuit shown in FIG. 4 for explaining isolating means, and FIG. 6B shows a top plan view of the semiconductor integrated circuit shown in FIG. 6A. FIG. 7A shows a cross-sectional view of a modification of the semiconductor integrated circuit shown in FIG. 6A, in which an oscillator 203-1, 203-2 is further isolated, FIG. 7B shows a top plan view of the modification of the semiconductor integrated circuit shown in FIG. 7A.

In FIG. 4, a semiconductor integrated circuit 10 is constructed with two PLLs 20A, 20B which are connected in series. The two PLLs 20A and 20B have substantially the same basic configuration, which is they are formed with an oscillator 203-1, 203-2, a divider 204-1, 204-2, a phase comparator 201-1, 201-2, and a loop filter 202-1, 202-2.

In each PLL, an oscillation output signal $203a$-1, $203a$-2 of the oscillator 203-1, 203-2 is divided by a division ratio $n_1$, $n_2$ ($n_1$, $n_2$=1, 2, 3, . . . ) in the divider 204-1, 204-2. A divided signal $204a$-1, $204a$-2 is compared with input data 11-1, 11-2 according to frequency and phase. A phase comparison signal 201a-1, 201a-2 produced from the phase comparator 201-1, 201-2 is moved through the loop filter 202-1, 202-2 and is integrated to generate an oscillation-frequency control signal 202a-1, 202a-2. By the oscillation-frequency control signal 202a-1, 202a-2, the frequency of the oscillator 203-1, 203-2 is controlled to $n_1$, $n_2$ times the frequency of the input data 11-1, 11-2.

In the semiconductor integrated circuit 10 according to the present invention, the two PLLs 20A and 20B are connected in series such that the oscillation output signal 203a-1 of the former-stage PLL 20A is provided to the phase comparator 201-2 of the latter-stage PLL 20B as the input data 11-2 of the PLL 20B. Further, the frequency $f_2$ of the oscillation output signal 203a-2 of the latter-stage PLL 20B is set to be higher than the frequency $f_1$ of the oscillation output signal 203a-1 of the former-stage PLL 20A.

Therefore, in the PLLs 20A and 20B, the first oscillator 203-1 and the second oscillator 203-2, and the first loop filter 202-1 and the second loop filter 202-2 respectively may be different from each other. Further, in one case, the division ratios $n_1$ and $n_2$ in the dividers 204-1 and 204-2 also may be different.

If the above-discussed semiconductor integrated circuit 10 is constructed with a single PLL, a divider having a division ratio $n_1 \times n_2$ is required, and an output oscillation signal of the semiconductor integrated circuit 10 may be generated by multiplying an input data 11-1 thereof by a large multiplication ratio ($n_1 \times n_2$).

In the semiconductor integrated circuit 10 shown in FIG. 4, since a plurality of PLLs are connected in series to construct the semiconductor integrated circuit, there is no need for a single PLL process using the large multiplication ratio, and each PLL circuit may process the multiplying operation by the multiplication ratio less than ($n_1 \times n_2$). The practical multiplication ratio (division ratio) allocated to each PLL is determined by a total multiplication ratio and the number of PLLs constituting the semiconductor integrated circuit.

For example, when the frequencies of the input data 11-1 and the oscillation output signal 203a-2 of the semiconductor integrated circuit 10 are respectively set to be 1 MHz and 100 MHz, the oscillation output signal 203a-2 is provided by multiplying the input data 11-1 by 100. However, in the semiconductor integrated circuit 10 constructed with the two PLLs 20A and 20B which are connected in series, for example, each PLL may be formed so as to respectively multiply the input data 11-1, 11-2 by 10 to generate the respective oscillation output signal 203a-1, 203a-2.

In the above-discussed configuration, the frequency $f_1$ of the oscillation output signal 203a-1 of the PLL 20A is 10 MHz, and the frequency $f_2$ of the oscillation output signal 203a-2 (an output signal of the semiconductor integrated circuit 10) of the PLL 20B is 100 MHz.

In this case, in each of the PLLs 20A and 20B, when the oscillator 203-1 203-2 operates so as to generate 10 pulses, at least one pulse of the input data 11-1, 11-2 may be supplied to the phase comparator 201-1, 201-2. Namely, as compared to the prior art case where a single PLL is used, 10 times the control information may be fed back to an oscillator control input through the phase comparator 201-1, 202-2 and the loop filter 202-1, 202-2.

Therefore, according to the present invention, even if a large total multiplication ratio (division ratio) is required for generating the high-frequency signal based on the low-frequency signal in the semiconductor integrated circuit using the PLL, by providing a plurality of PLLs connected in series, the large total multiplication ratio may be divided into the plurality of PLLs. Accordingly, the control information for the oscillator increases, and, thus, an extremely stable high-frequency oscillation output signal may be produced.

In the following, a description will be given of the control range of the oscillation-frequency control signals 202a-1 and 202a-2 of the PLLs 20A and 20B in the semiconductor integrated circuit 10 shown in FIG. 4, by referring to FIG. 5A and FIG. 5B.

In the semiconductor integrated circuit 10 according to the present invention, the loop filter 202-2 of the latter PLL 20B is formed so that the control range of the oscillation-frequency control signal 202a-2 of the loop filter 202-2 is larger than that of the oscillation-frequency control signal 202a-1 of the loop filter 202-1 in the former PLL 20A.

In FIG. 5A and FIG. 5B, when the oscillation-frequency control signal 202a-1 of the former PLL 20A is V1 (V), the frequency of the oscillation output signal 203a-1 of the PLL 20A is f1 (Hz). In this case, the control range of the oscillation-frequency control signal 202a-1 about V1 is represented by $\delta$V1 (V), and the variable frequency range of the oscillation output signal 203a-1 about f1 is represented by $\delta$f1 (Hz).

In the same way, when the oscillation-frequency control signal 202a-2 of the latter PLL 20B is V2 (V), the frequency of the oscillation output signal 203a-2 of the PLL 20B is f2 (Hz). In this case, the control range of the oscillation-frequency control signal 202a-2 about V2 is represented by $\delta$V2 (V), and the variable frequency range of the oscillation output signal 203a-2 about f2 is represented by $\delta$f2 (Hz).

Further, FIG. 5A and FIG. 5B show cases where the oscillators 203-1 and 203-2 have substantially the same output frequency conversion gain (a ratio of the variable frequency range $\delta$f of the oscillation output signal 203a to the control range $\delta$V of the oscillation-frequency control signal 202a:$\delta$f/$\delta$V). Therefore, the ratio $\delta$f1/$\delta$V1 in the first oscillator 203-1 is substantially equal to the ratio $\delta$f2/$\delta$V2 in the second oscillator 203-2.

As shown in FIG. 5B, if the control range $\delta$V1 of the oscillation-frequency control signal 202a-1 of the former PLL 20A is substantially the same as the control range $\delta$V2 of the oscillation-frequency control signal 202a-2 of the latter PLL 20B, the variable frequency range $\delta$f1 of the first oscillator 203-1 of the PLL 20A is also the same as the variable frequency range $\delta$f2 of the second oscillator 203-2 of the PLL 20B.

In the above case, since the frequency f2 of the second oscillator 203-2 is higher than the frequency f1 of the first oscillator 203-1, a ratio of the variable frequency range $\delta$f2 to the oscillation frequency f2 in the PLL 20B is less than a ratio of the variable frequency range $\delta$f1 to the oscillation frequency f1 in the PLL 20A by f1/f2.

For example, on the assumption that f1=10 MHz, and f2=100 MHz, the ratio $\delta$f2/f2 is less than the ratio $\delta$f1/f1 by 1/10. As a result, there is a problem that control performance of the oscillation output signal 203a-2 in the PLL 20B may be degraded as compared to that of the oscillation output signal 203a-1 in the PLL 20A by approximately 1/10.

Therefore, in the semiconductor integrated circuit 10 according to the present invention, as shown in FIG. 5A, so that the control performance of the oscillation output signal 203a-2 in the PLL 20B may be equal to or larger than that of the oscillation output signal 203a-1 in the PLL 20A, the control range $\delta$V2 of the oscillation-frequency control signal 202a-2 is set to be larger than the control range $\delta$V1 of the oscillation-frequency control signal 202a-1.

For methods of achieving the above-discussed condition, for example, a time constant of the second loop filter 202-2 in the PLL 20B is set to be less than that of the first loop filter 202-1 in the PLL 20A. In another method, an amplifier may be provided between the second loop filter 202-2 and the second oscillator 203-2 in the PLL 20B in order to amplify the oscillation-frequency control signal 202a-2 of the PLL 20B so as to be larger than the oscillation-frequency control signal 202a-1 of the PLL 20A.

As discussed above, according to the present invention, in addition to providing a plurality of PLLs connected in series, the control range of the oscillation-frequency control signal 202a-2 of the latter connected PLL 20B is adjusted so that the variable frequency range of the oscillation output signal 203a-2 of the PLL 20B is larger than that of the oscillation output signal 203a-1 in the former connected PLL 20A. Therefore, even if a large multiplication ratio is required to generate a high-frequency signal in the semiconductor integrated circuit using the PLL circuit, a stable oscillation signal may be obtained in each PLL stage, and, thus, an extremely stable high-frequency oscillation signal may be obtained from the whole semiconductor integrated circuit.

In the above description, as shown in FIG. 5A, the discussion has been given in the case where the oscillators 203-1 and 203-2 have substantially the same output frequency conversion gain (the ratio $\delta f1/\delta V1$ in the first oscillator 203-1 is substantially equal to the ratio $\delta f2/\delta V2$ in the second oscillator 203-2). However, the present invention is not limited to the above case, but the following method is also applicable.

Namely, for increasing the variable frequency range of the oscillation output signal 203a-2 in the latter connected PLL 20B as compared to that in the former connected PLL 20A, the output frequency conversion gain $\delta f2/\delta V2$ in the second oscillator 203-2 of the PLL 20B is set to be larger than the output frequency conversion gain $\delta f1/\delta V1$ in the first oscillator 203-1 of the PLL 20A.

Therefore, also in the above-discussed method that the output frequency conversion gain $\delta f2/\delta V2$ in the latter connected PLL 20B is set to be larger than the output frequency conversion gain $\delta f1/\delta V1$ in the former connected PLL 20A, even if a large multiplication ratio is required to generate a high-frequency signal in the semiconductor integrated circuit using the PLL circuit, an extremely stable high-frequency oscillation signal may be obtained from the semiconductor integrated circuit.

Next, a description will be given of a manufacture configuration of the semiconductor integrated circuit 10 using the PLLs, by referring to FIG. 6A to FIG. 7B. In the semiconductor integrated circuit 10 according to the present invention, a plurality of PLLs 20A, 20B are formed in the same LSI substrate for integrating a number of PLLs with high density. However, when a plurality of PLLs are integrated with high density, there is a problem that electromagnetic interruption generated from the PLLs may influence the other PLLs.

Therefore, as shown in FIG. 6A and FIG. 6B, between regions 22 of the PLLs 20A, 20B, isolating regions 23 for electrically isolating the PLLs from each other are provided. In addition to providing the isolating regions 23 between the PLLs, as shown in FIG. 7A and FIG. 7B, other isolating regions 23 may be provided around the oscillators 203 in the respective PLLs in order to further isolate the electromagnetic interruption caused by the oscillators 203 of the PLLs. As a result, in the semiconductor integrated circuit 10, a further stable high-frequency oscillation output signal may be generated.

Figure 8:
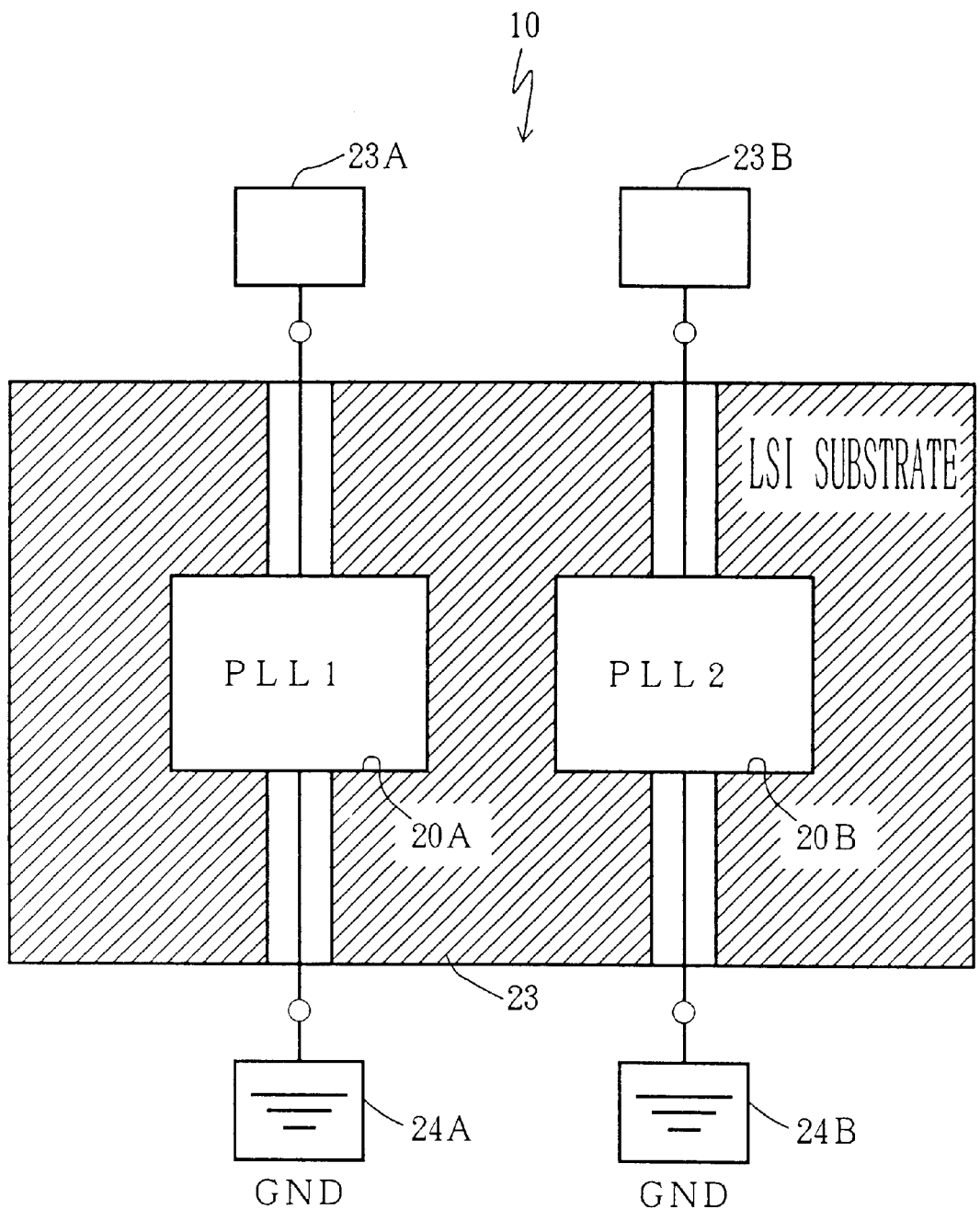
FIG. 8 shows a block diagram of a second embodiment of the first-type semiconductor integrated circuit using a plurality of PLLs according to the present invention.

Next, a description will be given of a second embodiment of the first-type semiconductor integrated circuit using a plurality of PLLs according to the present invention, by referring to FIG. 8 to FIG. 11. FIG. 8 shows a block diagram of the second embodiment of the first-type semiconductor integrated circuit using a plurality of PLLs according to the present invention. In the second embodiment, power sources 23A, 23B and earth grounds 24A, 24B are respectively provided for the respective PLLs 20A, 20B in the first embodiment shown in FIG. 4.

Figure 9:
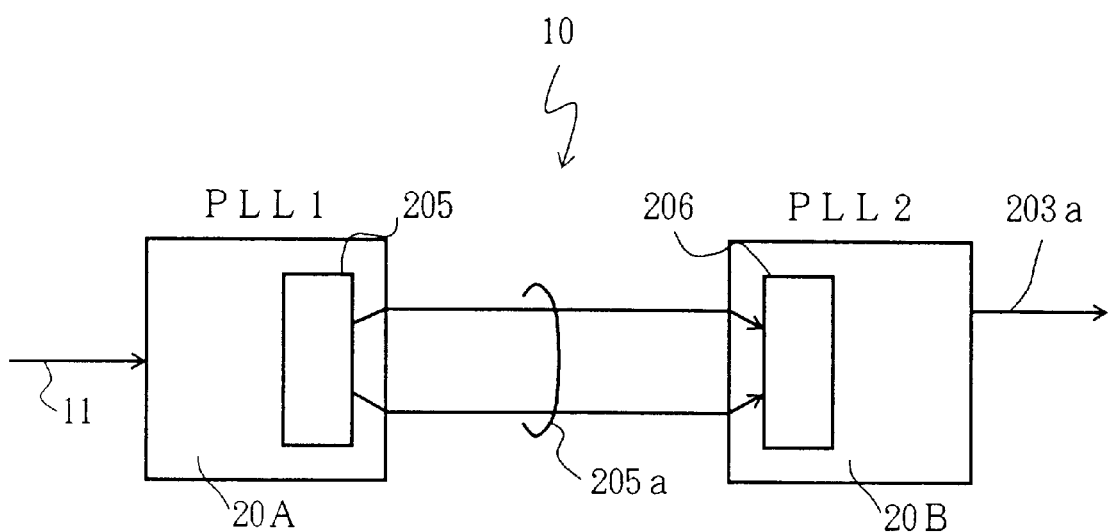
FIG. 9 shows an illustration for explaining a connection configuration of the PLLs of the second embodiment of the first-type semiconductor integrated circuit shown in FIG. 8.
Figure 10:
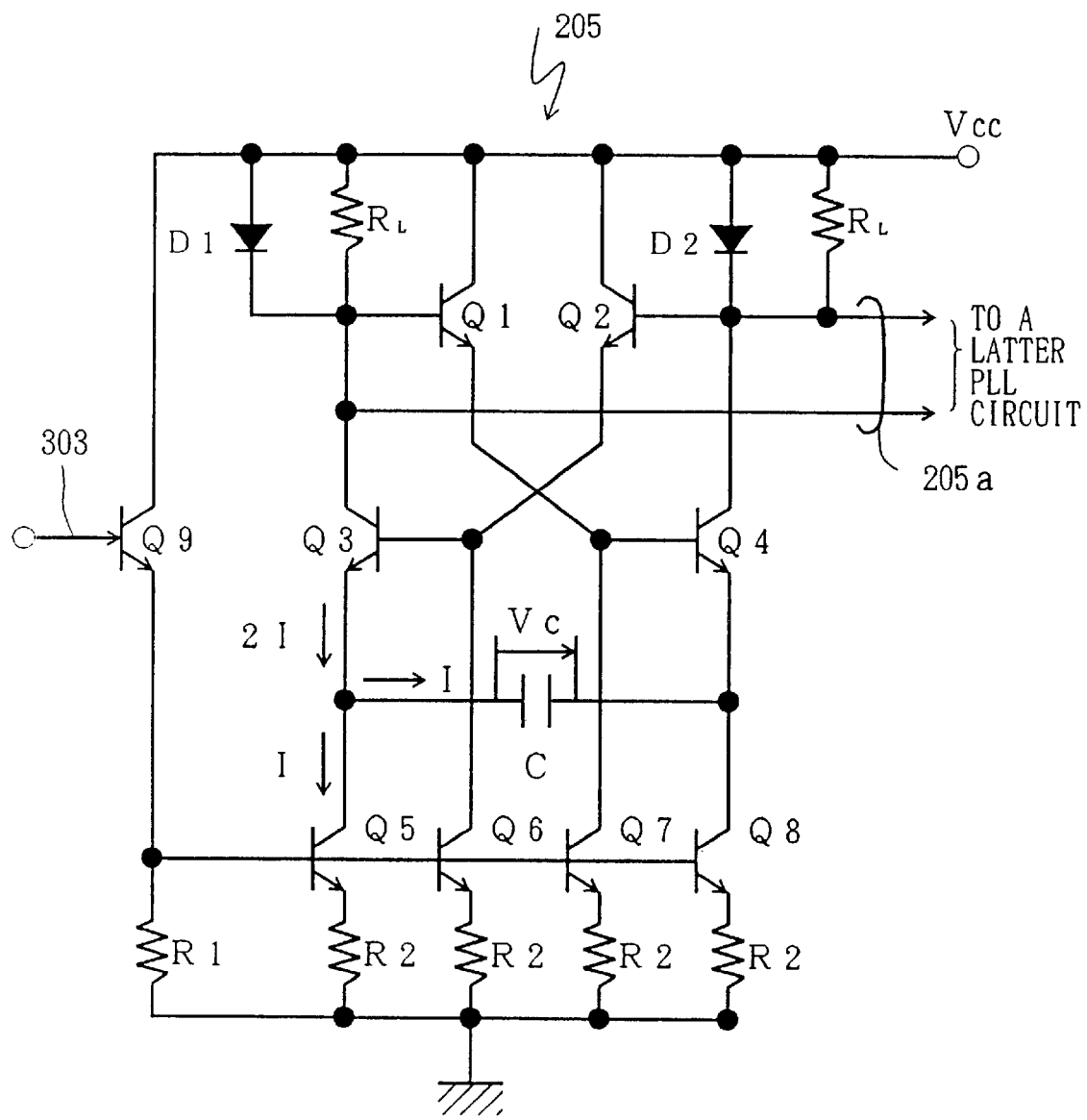
FIG. 10 shows a schematic diagram of an oscillator including a differential output circuit in the semiconductor integrated circuit shown in FIG. 9.
Figure 11:
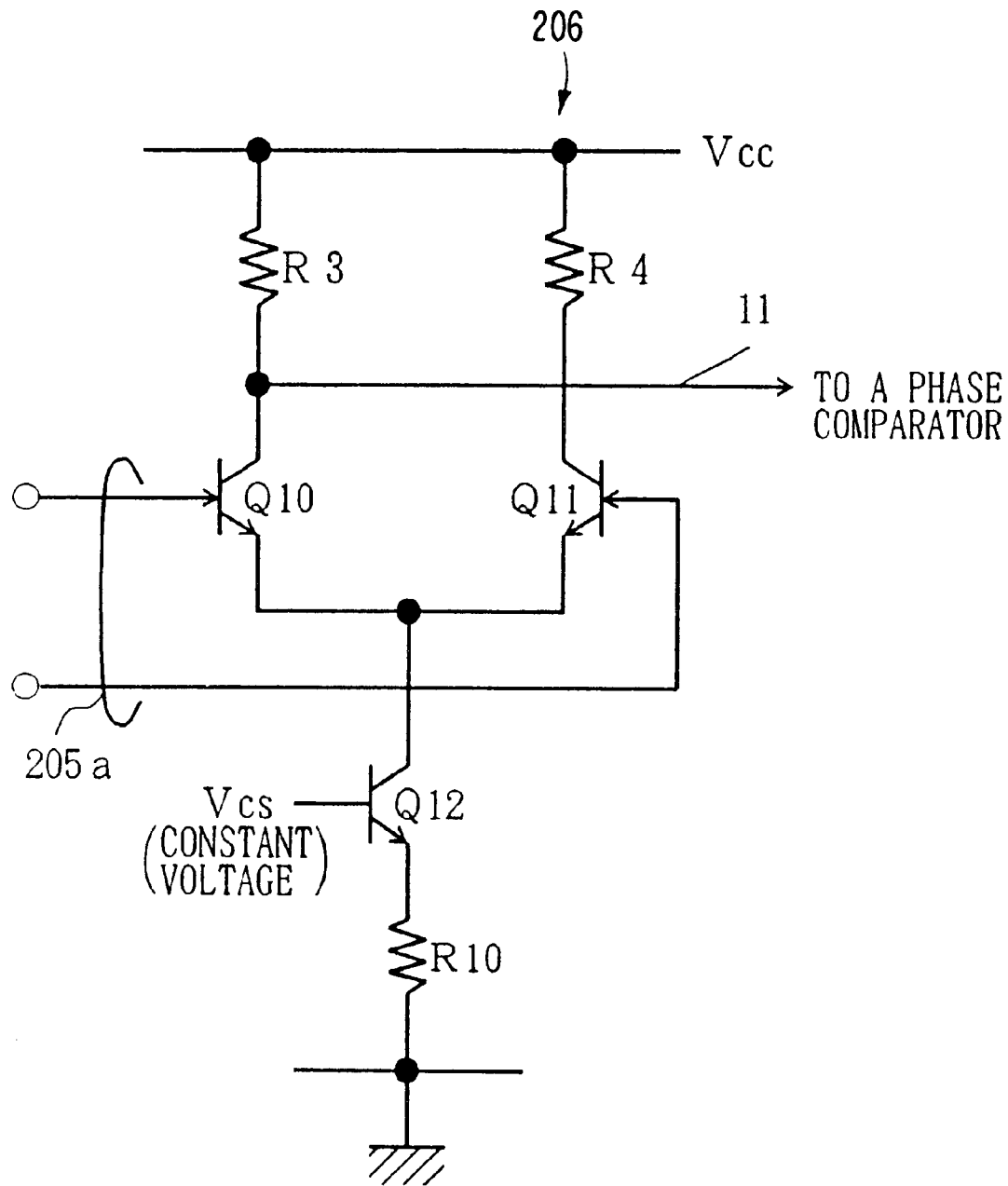
FIG. 11 shows a schematic diagram of a differential receive circuit in the semiconductor integrated circuit shown in FIG. 9.

FIG. 9 shows an illustration for explaining a connection configuration of the PLLs 20A and 20B of the second embodiment of the first-type semiconductor integrated circuit. FIG. 10 shows a schematic diagram of an oscillator including a differential output circuit in the semiconductor integrated circuit shown in FIG. 9. FIG. 11 shows a schematic diagram of a differential receive circuit in the semiconductor integrated circuit shown in FIG. 9.

Elements in the second embodiment which are the same as those of the first embodiment are given the same reference numerals.

In the first embodiment of the semiconductor integrated circuit 10 shown in FIG. 6B, the isolating regions 23 are provided around respective PLL circuit regions. In the second embodiment of the semiconductor integrated circuit 10 shown in FIG. 8, dedicated power sources 23A, 23B (each power source voltage is Vcc) are respectively provided for each PLL 20A, 20B.

In further detail, to the PLL 20A, the power source 23A for supplying operating power and an earth ground 24A are connected, and to the PLL 20B, the power source 23B for supplying operating power and an earth ground 24B are connected. In the configuration, the power source 23A and the power source 23B are electrically isolated from each other, and, also the earth ground 24A and the earth ground 24B are electrically isolated from each other.

In this way, by electrically isolating the power sources 23A, 23B, and the earth grounds 24A, 24B, the electromagnetic interruption between the PLLs 20A and 20B may be reduced. As a result, an extremely stable high-frequency oscillation output signal may be generated in the second embodiment of the semiconductor integrated circuit 10.

In the second embodiment of the semiconductor integrated circuit 10, since the individual power source 23A, 23B is provided for each PLL circuit 20A, 20B, the output signal and the input signal between the PLL circuits 20A, 20B are converted to a differential signal. Therefore, in the PLL 20A, a differential output circuit 205 for generating the differential signal is provided, and in the PLL 20B, a differential receive circuit 206 for receiving the differential signal is provided.

In further detail, as shown in FIG. 9, the oscillation output signal 203a-1 of the former PLL 20A is converted to a differential oscillation output signal 205a in the differential output circuit 205, and, substantially the differential oscillation output signal 205a is provided to an input of the differential receive circuit 206 of the PLL 20B.

As shown in FIG. 11, the differential receive circuit 206 in the PLL 20B receives the differential oscillation output signal 205a produced from the differential output circuit 205, and converts it into the single-line input data 11-2 to provide it to the phase comparator 201-2 of the PLL 20B.

On the other hand, in the first oscillator 203-1, a part of which is shown in FIG. 10, the differential output circuit 205 is included as a differential conversion circuit. The oscillation output signal 203a-1 of the first oscillator 203-1 is converted into the differential oscillation output signal 205a by the included differential output circuit 205. Therefore, in the second embodiment, the differential oscillation output signal 205a is provided to the latter PLL 20B, as compared to the first embodiment in which the single oscillation output signal 203a-1 of the PLL 20A is provided to the PLL 20B.

As discussed above, the PLL 20B is connected to the PLL 20A in series through the differential oscillation output signal 205a. However, as shown in FIG. 9, on an input side of the PLL 20A, the differential receive circuit 206 is not provided. Instead, the single-line input data 11 is directly applied to the phase comparator 201-1 of the PLL 20A. Further, on an output side of the PLL 20B, the differential output circuit 205 is not provided. Instead, the single-line oscillation output signal 203a-2 is produced from the second oscillator 203-2 of the PLL 20B.

In the following, detailed descriptions will be given of operations of the differential output circuit 205 and the differential receive circuit 206.

In FIG. 10, the first oscillator 203-1 including the differential output circuit 205 in the former PLL 20A is a voltage-controlled oscillator circuit using an emitter-coupled-type multivibrator constructed with transistors Q1 to Q9, resistors R1, R2, and load resistors RL. The load resistors RL connected to the power source Vcc are elements for setting a current 2I (=0.7/RL) by which an oscillation frequency is determined using a voltage decrease (approximately 0.7 V) due to diodes D1, D2. An externally input control voltage 303 is a signal for controlling an amplitude voltage of the oscillation output signal 203a-1 of the PLL 20A.

In the following, the oscillation operation of the first oscillator 203-1 (emitter-coupled-type multivibrator) including the differential output circuit 205 will be analyzed.

In the emitter-coupled-type multivibrator 203, a constant-current circuit is constructed with the transistors Q5 to Q8, the diodes D1, D2, and the resistor R2. The transistor Q9 is used for an emitter follower transistor. The diodes D1, D2, and the transistors Q1, Q2 are respectively diodes and transistors for a level shift, and make the basic emitter-coupled-type multivibrator constructed with the transistors Q3 and Q4 operate in a high-frequency region which is an active state of the transistors Q3, Q4. When such level-shift diodes and transistors are not provided, the basic emitter-coupled-type multivibrator is subject to operate at a saturation state.

Next, a description will be given of an oscillation time period of the above-discussed emitter-coupled-type multivibrator.

When the transistor Q1 is set to be in an ON state and the transistor Q4 is set to be in an OFF state, since a base voltage of the transistor Q3 is 4.3 V, a current I flows from an emitter side of the transistor Q3 to an emitter side of the transistor Q4 as shown by an arrow, a capacitor C is charged, whereby a voltage potential of the transistor Q4 decreases. When a voltage on the emitter side of the transistor Q4 becomes less than a base voltage of the transistor Q4 by approximately 0.7 V, the transistor Q4 is set to be in an ON state, and the transistor Q3 is set to be in an OFF state. As a result, a collector voltage of the transistor Q4 is inverted. After that, the above-discussed operation is repeated, and, thus, the oscillation operation may be carried out.

In the oscillation operation, the oscillation time period is determined by a charging time of the capacitor C, a charging current I, etc. In further detail, when a voltage between the base and the emitter of the transistor is represented by VBE, the oscillation time period T is given by the following equation.

$$T(=1/\text{oscillation frequency}) = 4C(VBE)/1$$

In FIG. 11, the differential receive circuit 206 of the PLL 20B is constructed with a differential amplifier circuit having the power source Vcc, transistors Q10, Q11, and resistors R3, R4, and a constant-current circuit connected to an emitter side of the differential amplifier circuit. The constant-current circuit is constructed with a transistor Q12 and a resistor R10, and is operative as a constant-current source for supplying a constant current to the differential amplifier circuit by controlling to apply a constant base voltage Vcs to a base of the transistor Q12.

Differential input ports constructed with bases of the transistors Q10, Q11 can receive the differential oscillation output signal 205a produced from the differential output circuit 205 of the PLL 20A. Further, the transistor Q10 converts the received differential oscillation output signal 205a into the single-line input data 11, and transmits it to the phase comparator 201-2 of the PLL 20B.

By using the above-discussed differential operation, the electromagnetic interruption between the PLLs may be reduced, and a mismatch between the PLLs may be prevented. As a result, an extremely stable high-frequency oscillation signal may be generated in the semiconductor integrated circuit 10.

Figure 12:
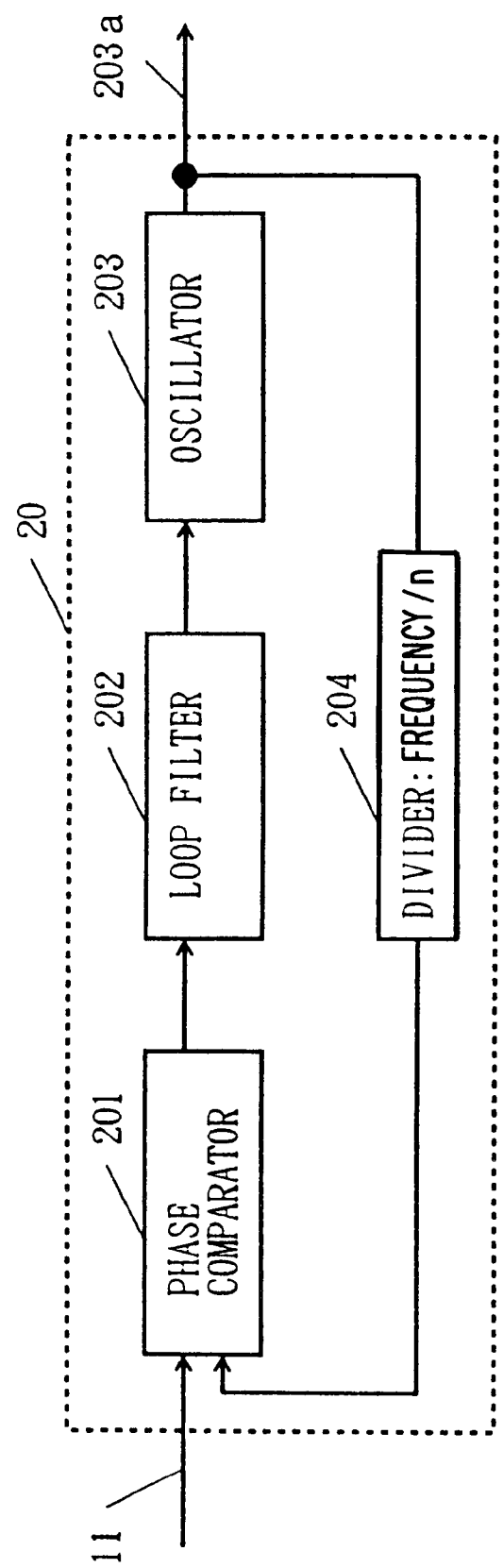
FIG. 12 shows a block diagram of a third embodiment of the first-type semiconductor integrated circuit using a PLL circuit according to the present invention.

Next, a description will be given of a third embodiment of the first-type semiconductor integrated circuit using a plurality of PLLs according to the present invention, by referring to FIG. 12. FIG. 12 shows a block diagram of the third embodiment of the first-type semiconductor integrated circuit using a plurality of PLLs according to the present invention. Elements in the third embodiment which are the same as those of the first and second embodiments are given the same reference numerals.

Before the description of the third embodiment, a problem in the first embodiment will be discussed. In the first embodiment of the semiconductor integrated circuit 10 shown in FIG. 4, by providing a plurality of PLLs connected in series and allocating the large division ratio into a plurality of small division ratios, degradation of the oscillation control information for each PLL circuit may be prevented, and, thus, an extremely stable frequency oscillation signal can be obtained.

In the first embodiment, as shown in FIG. 5A, when the oscillation-frequency control signal 202a-1 of the former PLL 20A is V1 (V), the frequency of the oscillation output signal 203a-1 of the PLL 20A is f1 (Hz). In this case, the control range of the oscillation-frequency control signal 202a-1 about V1 is represented by δV1 (V), and the variable frequency range of the oscillation output signal 203a-1 about the f1 is represented by δf1 (Hz).

In the same way, when the oscillation-frequency control signal 202a-2 of the latter PLL 20B is V2 (V), the frequency of the oscillation output signal 203a-2 of the PLL 20B is f2 (Hz). In this case, the control range of the oscillation-frequency control signal 202a-2 about V2 is represented by δV2 (V), and the variable frequency range of the oscillation output signal 203a-2 about the f2 is represented by δf2 (Hz).

For example, in the above-discussed PLL 20B, when the frequency f2 of the oscillation output signal 203a-2 of the second oscillator 203-2 is divided by the division ratio n in the divider 204-2, and is equal to the frequency f1 of the input data 11-2, the variable frequency range δf2 is also divided into δf2/n according to the division ratio n. Therefore, the variable frequency range δf2/n is fed back to the phase comparator 201-2, and, thus, the control range in the phase comparator 201-2 is decreased. As a result, there is a problem in that an operation range of the phase comparator 201-2 may be reduced.

On the contrary, in the third embodiment of the semiconductor integrated circuit 10 shown in FIG. 12, a single PLL circuit 20 may be provided. In the PLL circuit 20, the division ratio n in the divider 204 is set so that a frequency obtained by dividing the frequency f2 of the oscillation output signal 203a by the division ratio n is less than the frequency f1 of the input data 11 (namely, f1<(f2/n)).

By setting the division ratio n of the divider 204 as discussed above, a relatively large variable frequency range δf2/n may be fed back to the phase comparator 201, and, thus, degradation of the control range in the phase comparator 201 may be reduced. Therefore, even if a large multiplication ratio is required to generate a high-frequency signal in the semiconductor integrated circuit using the PLL circuit, an extremely stable high-frequency oscillation signal may be obtained from the semiconductor integrated circuit.

In the above-discussed first and second embodiments of the first-type semiconductor integrated circuit according to the present invention, the two PLL circuits 20A and 20B are provided. However, the present invention is not limited to the above configuration, but is applicable to a semiconductor integrated circuit having a plurality of PLLs more than two PLLs.

Further, in the third embodiment of the semiconductor integrated circuit shown in FIG. 12, a single PLL is provided. However, the configuration of the PLL shown in FIG. 12 (third embodiment) is applicable to at least one of the PLLs shown in the first and second embodiments.

(2) Second-type semiconductor integrated circuit

Next, descriptions will be given of the second-type semiconductor integrated circuit according to the present invention. The second-type semiconductor integrated circuit according to the present invention shows a clock recovery circuit using the PLL circuit.

Figure 13:
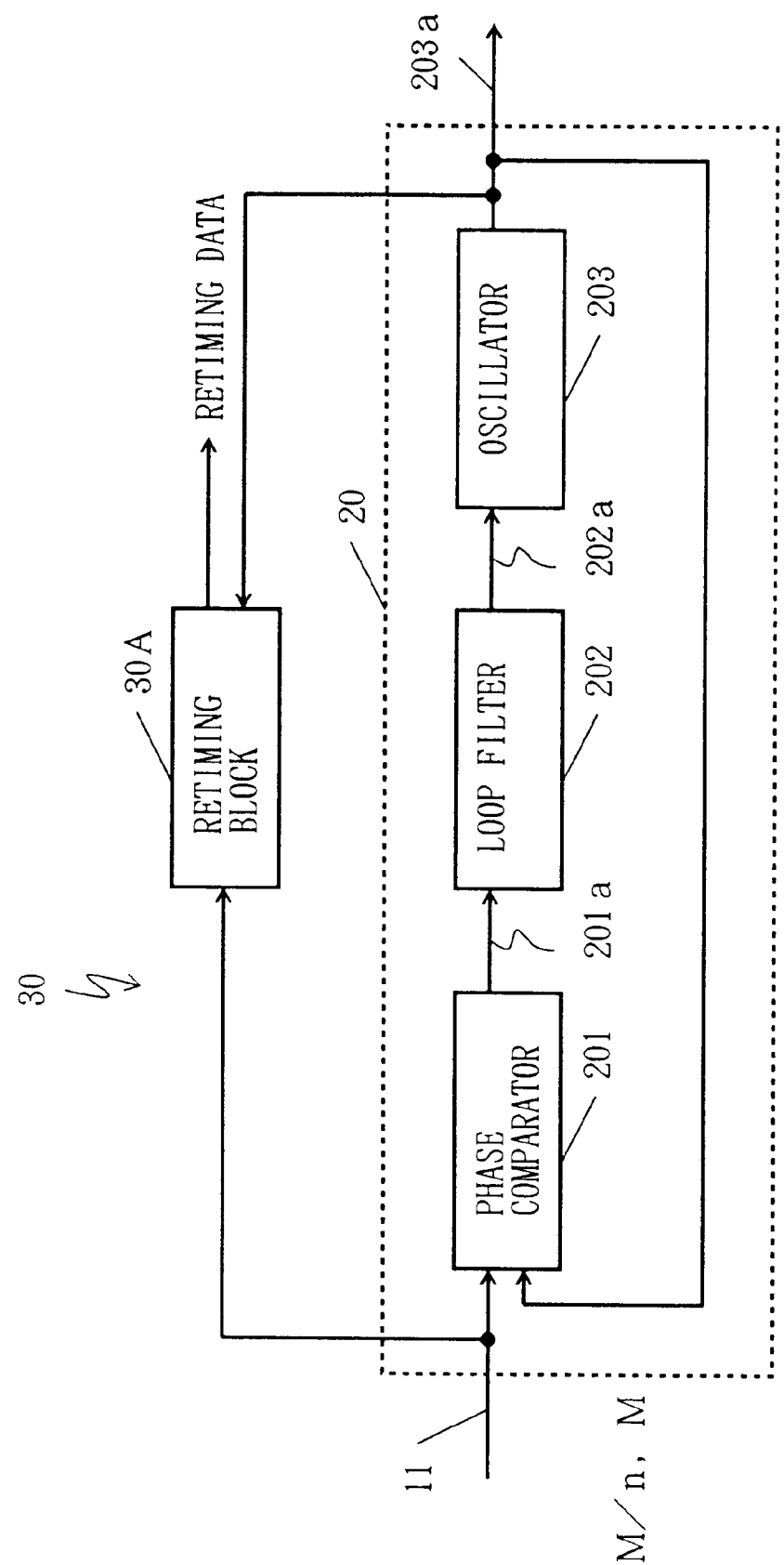
FIG. 13 shows a first embodiment of a second-type semiconductor integrated circuit according to the present invention using a PLL circuit as a clock recovery circuit.

FIG. 13 shows a first embodiment of the second-type semiconductor integrated circuit according to the present invention using a PLL circuit as a clock recovery circuit. Elements in FIG. 13 which are the same as those of FIG. 12 are given the same reference numerals.

Figure 1:
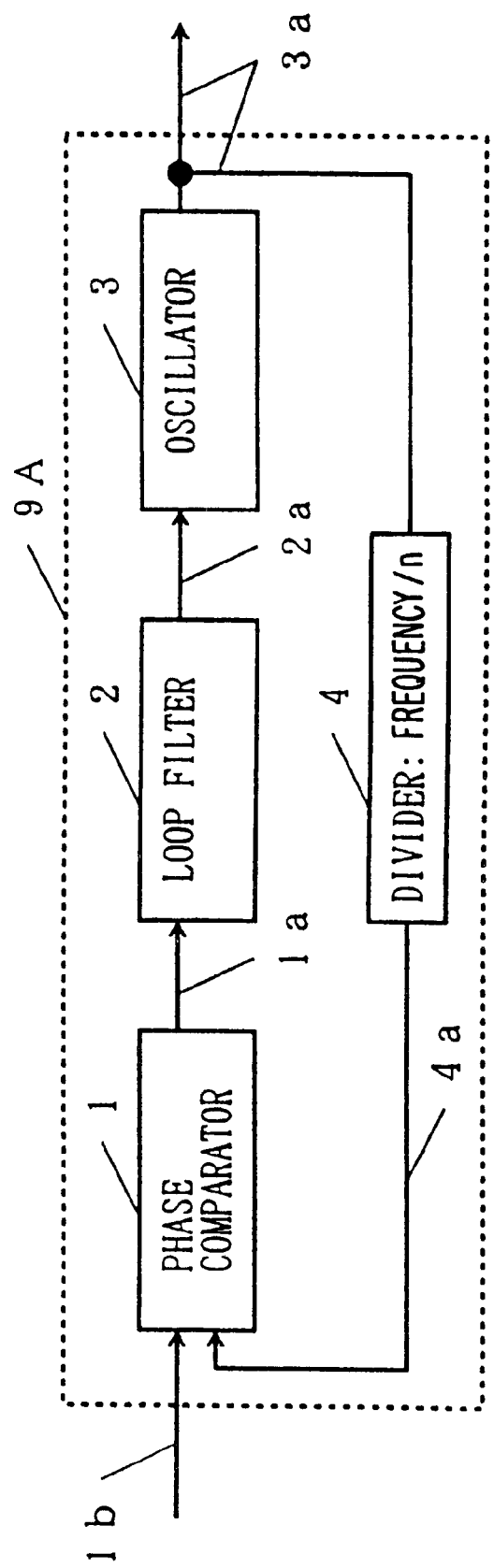
FIG. 1 shows a prior art semiconductor integrated circuit using a phase-locked loop (PLL)
Figure 2:
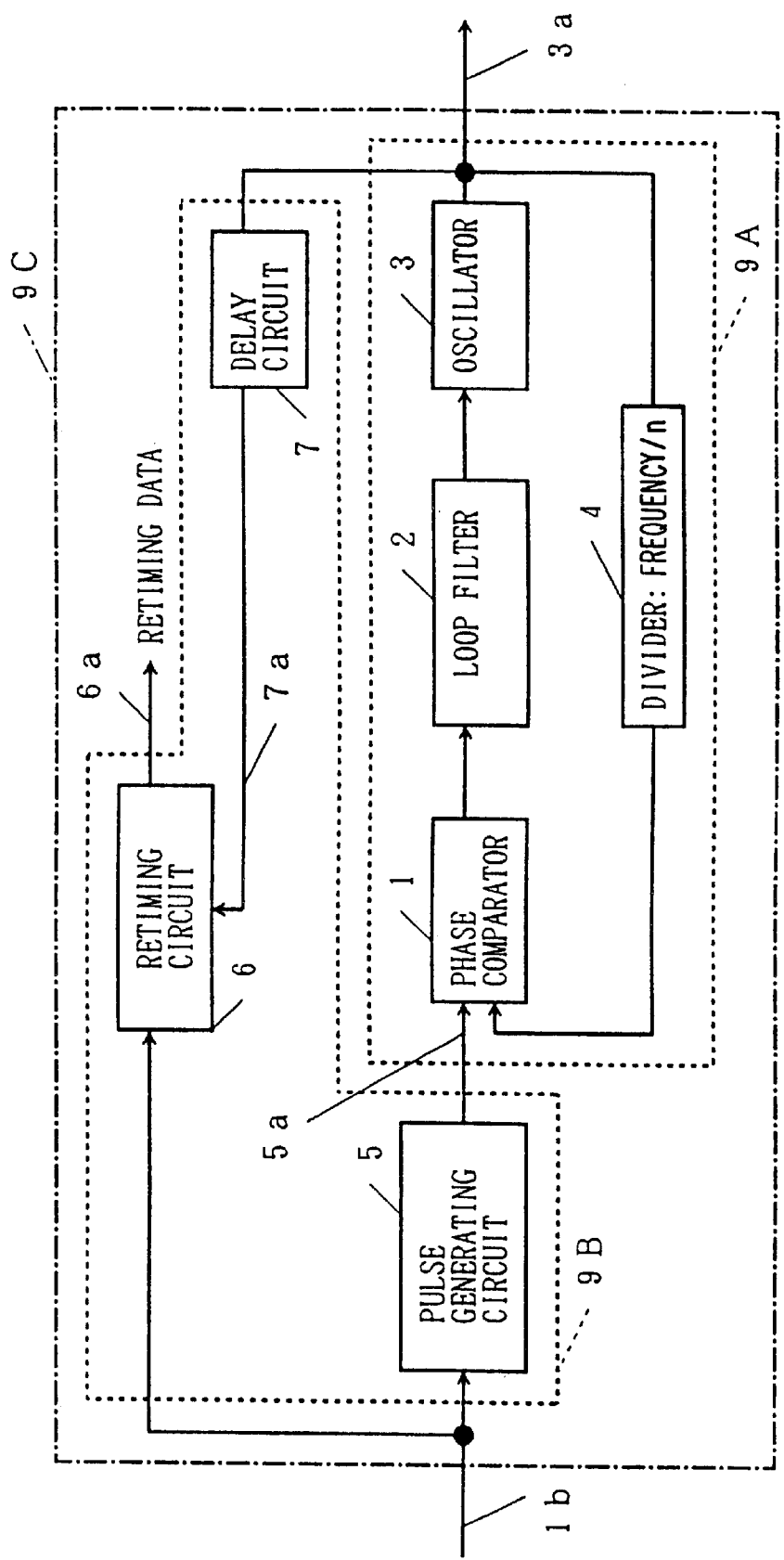
FIG. 2 shows a second configuration example of the prior art semiconductor integrated circuit using the PLL.
Figure 3:
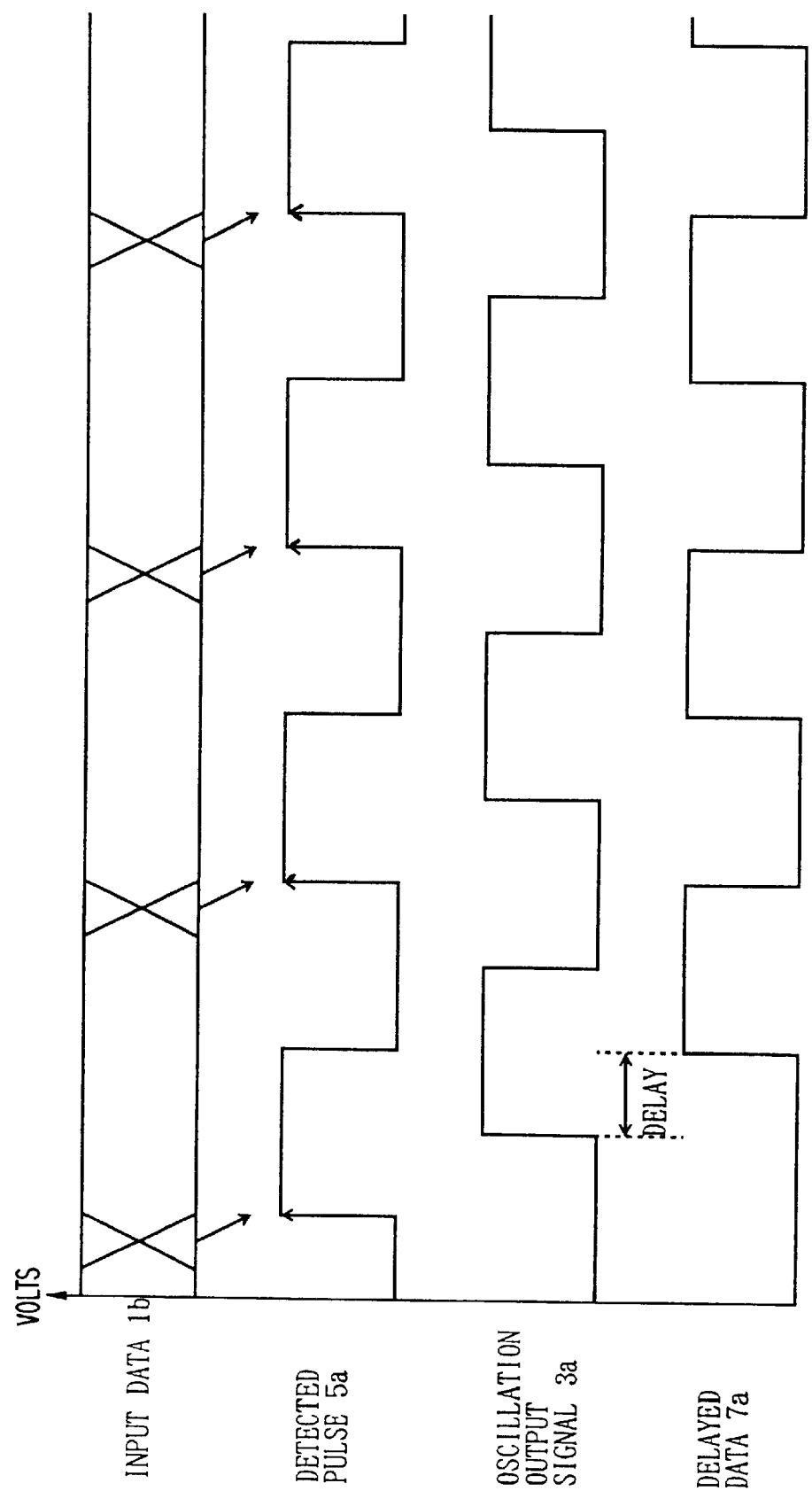
FIG. 3 shows a timing chart of the second configuration example of the prior art semiconductor integrated circuit shown in FIG. 2.

In a conventional clock recovery circuit using the PLL, in addition to the PLL circuit constructed with the oscillator, the divider, the phase comparator, and the loop filter, a retiming block, for example, the block 9B shown in FIG. 2 is provided. In the above-discussed clock recovery circuit, an input data having communication random data (irregularly transmitted communication data) is provided to the phase comparator, but the input data synchronized with a clock (regularly transmitted communication data) shown in FIG. 4 is not provided to the phase comparator.

Therefore, in the PLL operation, a degree of control information for controlling the oscillator is less than that of the conventional PLL in which the regularly transmitted data is provided. Accordingly, when the conventional PLL is used in the clock recovery circuit, there is a problem in that the PLL operation may become unstable, and an error may occur in the retiming data.

To overcome the above-discussed problem, a semiconductor integrated circuit 30 shown in FIG. 13 is proposed. In the semiconductor integrated circuit 30, a PLL circuit 20 and a retiming block 30A constitute the clock recovery circuit. The PLL circuit 20 is constructed with an oscillator 203, a phase comparator 201, and a loop filter 202. In the PLL circuit 20, a divider is not provided. The retiming block 30A may be constructed with the conventional circuits shown in FIG. 2.

Since the semiconductor integrated circuit 30 is operative as a clock recovery circuit, instead of the clock synchronized input data (regularly transmitted data), the random communication data (irregularly transmitted data) as input data 11 is provided to the phase comparator 201.

In the phase comparator 201, the input data 11 is directly compared with the oscillation output signal 203a according to phase and frequency, and a phase comparison signal 201a is produced as a result of comparison. The phase comparison signal 201a is integrated and converted to an oscillation-frequency control signal 202a in the loop filter 202. By the oscillation-frequency control signal 202a, the frequency of the oscillator 203 is controlled so as to be adjusted to a frequency of a clock included in the input data 11.

Further, in the semiconductor integrated circuit 30, a data transmission rate M (bps) of the input data 11 may be changed to a rate M/n (n=1, 2, 3, ...). Therefore, for always adjusting the data transmission rate M/n of the input data 11, the oscillator 203 is fabricated so as to generate a plurality of frequencies corresponding to the data transmission rate M/n.

Namely, when the data transmission rate of the input data 11 is M, the oscillator 203 generates the oscillation output signal 203a at a frequency M (Hz), when the data transmission rate of the input data 11 is M/2, the oscillator 203 generates the oscillation output signal 203a at a frequency M/2 (Hz), and when the data transmission rate of the input data 11 is M/3, the oscillator 203 generates the oscillation output signal 203a at a frequency M/3 (Hz) . . . .

In this way, the oscillation output signal 203a is fed back to the phase comparator 201 without passing through the divider, and is always directly compared with the input data 11. Therefore, a degree of control information produced from the phase comparator 201 may be increased as compared to the conventional PLL including the divider and the oscillator generating only one frequency band. As a result, an error is prevented from being caused in the retiming data.

In the following, a description will be given of the oscillator 203 shown in FIG. 13.

Figure 14:
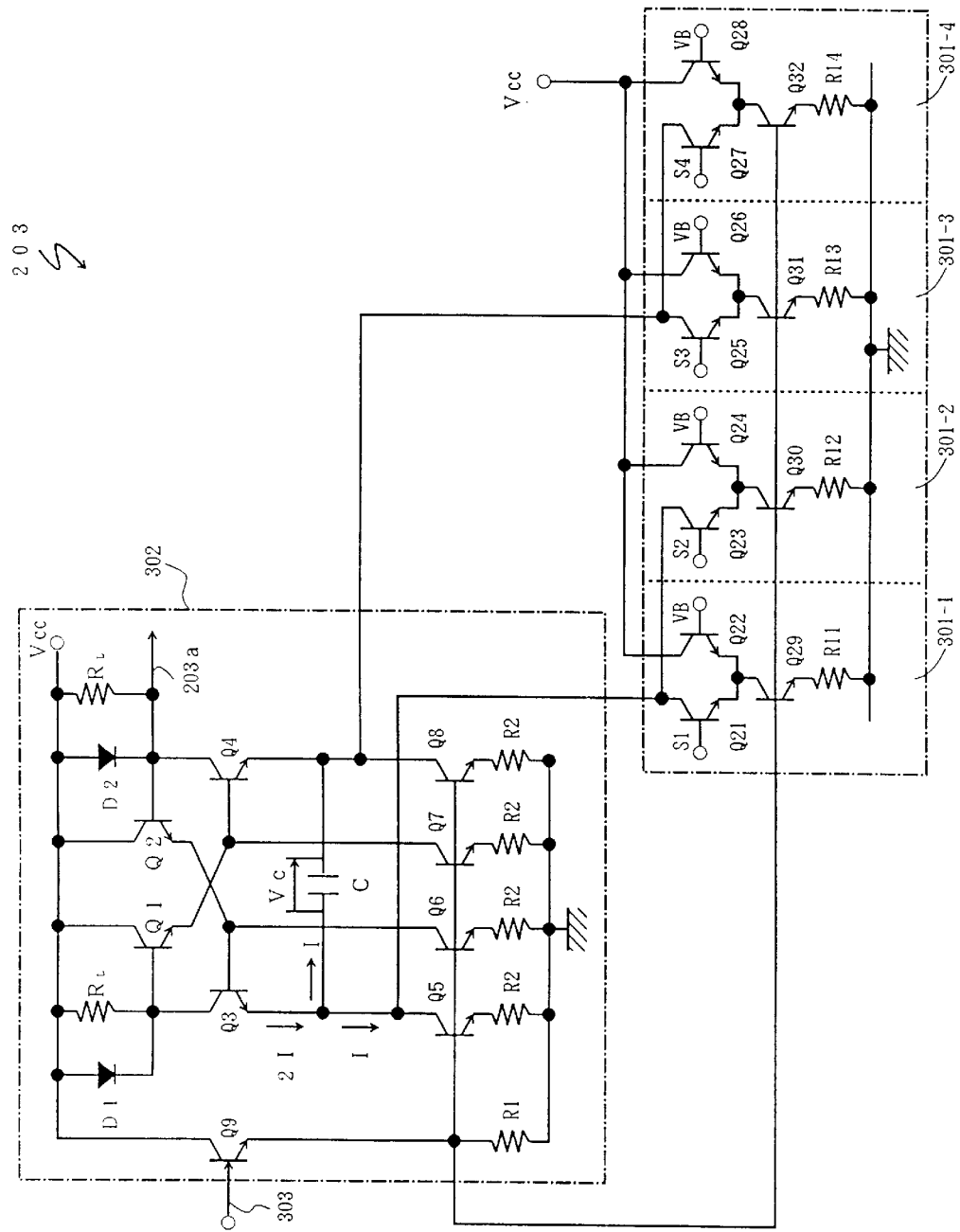
FIG. 14 shows a schematic diagram of an oscillator oscillating at multiple frequency bands, which oscillator is used in the first embodiment of the second-type semiconductor integrated circuit shown in FIG. 13.

FIG. 14 shows a schematic diagram of the oscillator 203 oscillating at multiple frequency bands shown in FIG. 13. The oscillator 203 shown in FIG. 14 is constructed with an emitter-coupled-type multivibrator 302 and a plurality of current switches 301-1 to 301-4. The emitter-coupled-type multivibrator 302 has substantially the same configuration as that of the oscillator 205 shown in FIG. 10.

In the emitter-coupled-type multivibrator 302 shown in FIG. 14, the oscillation output signal 203a is produced as a single line output. The current switches 301-1, 301-2 are connected to a first current path of the emitter-coupled-type multivibrator 302, and the current switches 301-3, 301-4 are connected to a second current path thereof. The current switches 301-1 to 301-4 are respectively controlled by current switch terminals S1 to S4.

According to ON and OFF operations of the current switches 301-1 to 301-4, the frequency of the oscillation output signal 203a of the oscillator 203 is controlled. In further detail, when the data transmission rate of the input data 11 is M/n (n=1, 2, 3, ...), the current switches 301-1 to 301-4 are controlled to be ON and OFF so that the oscillator 203 generates the oscillation output signal 203a at frequency M/n (Hz).

In the following, a detailed description will be given of operations of the emitter-coupled-type multivibrator 302 and the current switches 301-1 to 301-4.

The current switch 301-1 is constructed with transistors Q21, Q22, Q29, and a resistor Rll, the current switch 301-2 is constructed with transistors Q23, Q24, Q30, and a resistor R12, the current switch 301-3 is constructed with transistors Q25, Q26, Q31, and a resistor R13, and the current switch 301-4 is constructed with transistors Q27, Q28, Q32, and a resistor R14. Collectors of the current switches 301-1 to 301-4 are connected to a power source voltage Vcc in common.

In the current switch 301-1, the transistors Q21 and Q22 construct a differential amplifier circuit and the transistor Q29 and the resistor R11 construct a constant-current circuit which is connected to an emitter-coupled side of the differential amplifier circuit. In the same way, the other current switches 301-2 to 301-4 are respectively constructed with the differential amplifier circuit and the constant-current circuit which is connected to the emitter-coupled side of the differential amplifier circuit.

Further, bases of the transistors Q21, Q23, Q25, and Q27 are respectively connected to the current switch terminals S1, S2, S3, and S4. Also, bases of the transistors Q22, Q24, Q26, and Q28 are connected to a constant voltage VB as a reference voltage.

For example, when a larger voltage than the constant voltage VB is applied to the current switch terminal S1 of the transistor Q21, the transistor Q21 is set to be conductive, and the transistor Q22 is set to be un-conductive. Therefore, the transistor Q29 is connected to the transistor Q5 in parallel. At this time, the current produced from the current source of the transistor Q5 and the current produced from the current source of the transistor Q29 which is set to be substantially the same as the current of the transistor Q5 may flow through the transistor Q3 of the multivibrator 302.

In the same way, when a larger voltage than the constant voltage VB is applied to the current switch terminal S2 of the transistor Q23, the transistor Q23 is set to be conductive, and the transistor Q24 is set to be non-conductive. Therefore, the transistor Q23 is connected to the transistor Q5 in parallel. At this time, the current produced from the current source of the transistor Q5 and the current produced from the current source of the transistor Q30 which is set to be substantially the same as the current of the transistor Q5 may flow through the transistor Q3 of the multivibrator 302.

Further, when a larger voltage than the constant voltage VB is applied to the current switch terminal S3 of the transistor Q25, the transistor Q25 is set to be conductive, and the transistor Q26 is set to be non-conductive. Therefore, the transistor Q25 is connected to the transistor Q8 in parallel. At this time, the current produced from the current source of the transistor Q8 and the current produced from the current source of the transistor Q31 which is set to be substantially the same as the current of the transistor Q8 may flow through the transistor Q4 of the multivibrator 302.

In the same way, when a larger voltage than the constant voltage VB is applied to the current switch terminal S4 of the transistor Q27, the transistor Q27 is set to be conductive, and the transistor Q28 is set to be non-conductive. Therefore, the transistor Q27 is connected to the transistor Q8 in parallel. At this time, the current produced from the current source of the transistor Q8 and the current produced from the current source of the transistor Q32 which is set to be substantially the same as the current of the transistor Q8 may flow through the transistor Q4 of the multivibrator 302.

In the oscillator 203 shown in FIG. 14, when all the current switches 301-1 to 301-4 are turned on, the currents produced from the current sources of the transistors Q5, Q29, and Q30 may flow through the transistor Q3, and the currents produced from the current sources of the transistors Q8, Q31, Q32 may flow through the transistor Q4. In this case, the current flowing through the multivibrator 302 is maximized, and according to the maximum current, the oscillation output signal 203a having the frequency M (Hz) is generated from the oscillator 203 (emitter-coupled-type multivibrator 302).

When the current switches 301-1 and 301-3 are turned on and the current switches 301-2 and 301-4 are turned off, the currents produced from the current sources of the transistors Q5 and Q29 may flow through the transistor Q3, and the currents produced from the current sources of the transistors Q8 and Q31 may flow through the transistor Q4. In this case, the current flowing through the multivibrator 302 is two-thirds of the maximum current, and, thus, the oscillation output signal 203a having the frequency M×⅔ (Hz) is generated from the oscillator 203 (emitter-coupled-type multivibrator 302).

When all the current switches 301-1 to 301-4 are turned off, the current produced from the current source of the transistor Q5 may flow through the transistor Q3, and the current produced from the current source of the transistor Q8 may flow through the transistor Q4. In this case, the current flowing through the multivibrator 302 is one-third of the maximum current, and, thus, the oscillation output signal 203a having the frequency M×⅓ (Hz) is generated from the oscillator 203 (emitter-coupled-type multivibrator 302).

In this way, in the above-discussed oscillator 203 which is constructed with the multivibrator 302 and the current switches 301-1 to 301-4, by controlling the current switches 301-1 to 301-4, the frequency of the oscillator 203 may be flexibly changed and may be easily adjusted to the transmission data rate of the input data 11 in the clock recovery circuit shown in FIG. 13.

Therefore, even if the transmission data rate of the input data to the clock recovery circuit is changed, the oscillation output signal whose frequency is the same as the transmission data rate may be generated and be directly compared with the input data according to phase and frequency. Accordingly, a degree of the control information produced from the phase comparator may be increased. As a result, a stable PLL operation in the clock recovery circuit may be carried out, and errorless recovery data may be generated.

Next, a description will be given of another configuration example of the oscillator 203 used in the second-type semiconductor integrated circuit according to the present invention shown in FIG. 13.

Figure 15:
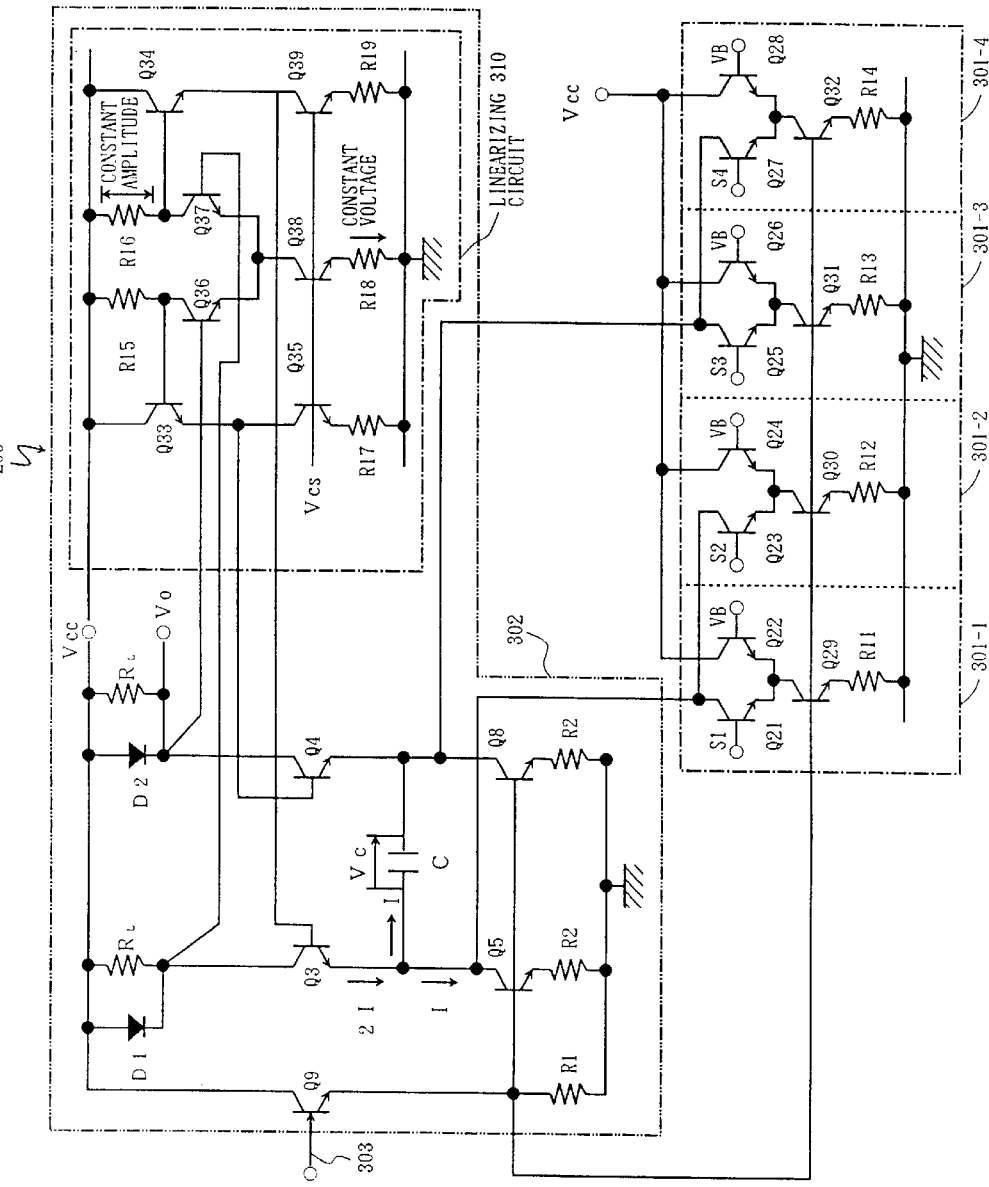
FIG. 15 shows a schematic diagram of another configuration example of the oscillator used in the first embodiment of the second-type semiconductor integrated circuit shown in FIG. 13.

FIG. 15 shows a schematic diagram of another configuration example of the oscillator 203 used in the second-type semiconductor integrated circuit according to the present invention shown in FIG. 13. Elements in FIG. 15 which are the same as those of FIG. 14 are given the same reference numerals.

In the oscillator 203 shown in FIG. 15, the emitter-coupled-type multivibrator 302 has substantially the same configuration as that of the multivibrator 302 shown in FIG. 14, and the same current switches 301-1 to 301-4 are also provided to the emitter-coupled-type multivibrator 302. Particularly, in the oscillator 203 shown in FIG. 15, a linearizing circuit 310 is provided on an output side of the emitter-coupled-type multivibrator 302.

In general, the frequency of the multivibrator 302 is determined by an amplitude voltage which is given by 2I×RL (2I is a current flowing through a load resistor RL). However, when the control voltage 303 for controlling the frequency of the multivibrator 302 is changed, the current 2I also changes. At this time, the amplitude voltage (=2I×RL) is also changed. In this case, for obtaining a linear output to the control voltage 303, the linearizing circuit (namely, means for carrying out a constant-current operation) needs to be provided.

When the linearizing circuit 310 is provided in the voltage-controlled-type emitter-coupled-type multivibrator 302, even if the externally supplied control voltage 303 is changed, the current 2I may be maintained at the constant current. Therefore, the amplitude voltage of the oscillation output signal 203a may be linearly controlled.

In the following, a detailed description will be given of an operation of the linearizing circuit 310 shown in FIG. 15. The linearizing circuit 310 is a differential-type constant-current circuit, which is constructed with transistors Q36, Q37, Q38 and resistors R15, R16, R18.

In the multivibrator 302 including the linearizing circuit 310, when the transistor Q36 detects a collector voltage of the transistor Q4 at a base of the transistor Q36, the transistor Q36 is set to be conductive. In the same way, when the transistor Q37 detects a collector voltage of the transistor Q3 at a base of the transistor Q37, the transistor Q37 is set to be conductive.

The transistor Q38 and the resistor R18 constitute a constant-current source circuit, which supplies a constant current to the resistors R15 and R16 by applying a constant base voltage Vcs to a base of the transistor Q38. The resistors R15, R16 and the constant current generate differential constant voltages. The differential constant voltages are differentially amplified in a differential amplifier constructed with transistors Q35, Q39 (which have respectively load transistors Q33, Q34 on the collector sides thereof).

The differential outputs from the transistors Q35, Q39 are respectively provided to the transistors Q3, Q4. In this way, since the differential outputs are generated based on the resistors R15, R16 and the constant current, the differential outputs provided to the Q3, Q4 are maintained at a constant value. Therefore, the current 2I flowing through the load RL may be also a constant current. As a result, the amplitude voltage of the oscillation output signal 203a may be linearly controlled.

As discussed above, by providing such a linearizing circuit 310 to the oscillator 203, a stable PLL operation in the clock recovery circuit may be carried out, and errorless recovery data may be generated from the semiconductor integrated circuit 30.

Next, a description will be given of still another configuration example of the oscillator 203 used in the second-type semiconductor integrated circuit according to the present invention shown in FIG. 13.

Figure 16:
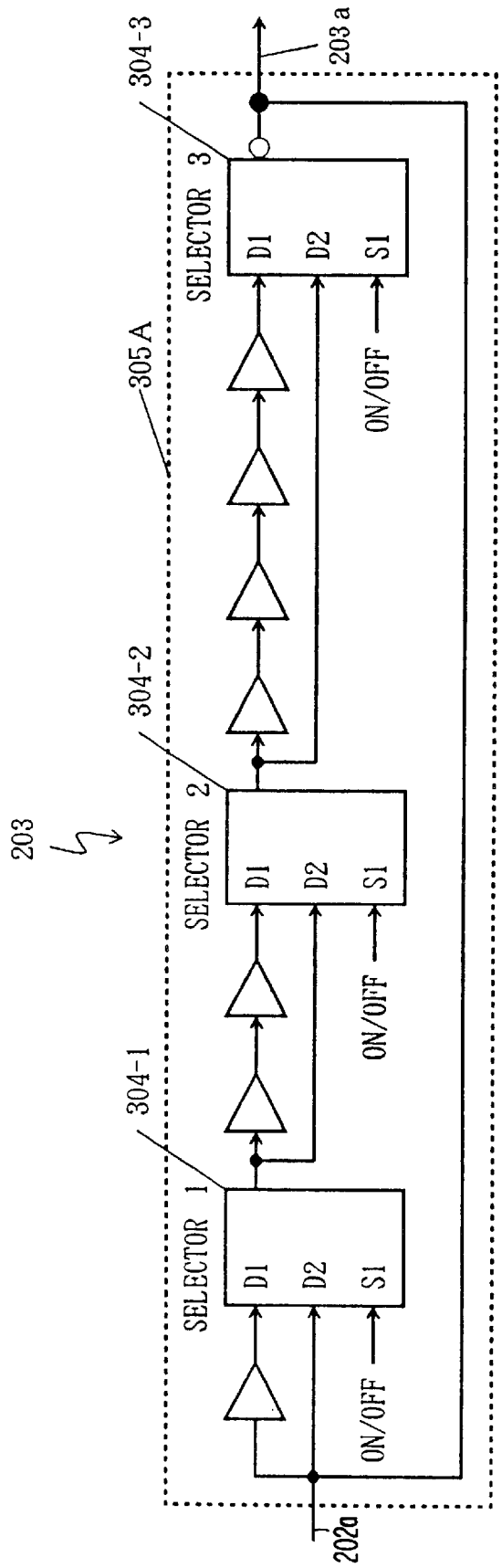
FIG. 16 shows a schematic diagram of still another configuration example of the oscillator used in the first embodiment of the second-type semiconductor integrated circuit according to the present invention shown in FIG. 13.

FIG. 16 shows a schematic diagram of still another configuration example of the oscillator 203 used in the second-type semiconductor integrated circuit according to the present invention shown in FIG. 13.

The oscillator 203 shown in FIG. 16 is constructed with a ring oscillator 305A in which a plurality of selectors 304-1 to 304-3 for switching a number of buffer gate stages are provided. By controlling the selectors 304-1 to 304-3, a loop delay in the ring oscillator 305A may be changed, whereby the oscillation frequency of the ring oscillator 305A may be also changed. The buffer gate stages for generating the loop delay and the selectors 304 are constructed so that the oscillation frequency of the oscillation output signal 203a may be changed to the frequency M/n (Hz) corresponding to the transmission rate of the input data 11 shown in FIG. 13.

In FIG. 16, for example, a transmission delay of each buffer gate stage is formed so as to be equal to a transmission delay of each selector (namely, it is considered that the selector is also one gate). In each selector, when an ON signal (for example, a logic "H") is provided to a selection terminal S1, a path D1 is selected, and when an OFF signal (for example, a logic "L") is provided to the selection terminal S1, a path D2 is selected.

When all the selectors 304-1 to 304-3 select the D2 paths by the OFF signals being provided to the selection terminals S1, the number of gate stages in the ring oscillator 305A is three gate stages which is the minimum number of stages. For example, the delay of one gate is set so that the frequency M of the oscillation output signal 203a is generated at that three stage condition.

In the above configuration, when the selectors 304-1, 304-2 are controlled to select the D1 paths and the selector 304-3 is controlled to select the D2 path, the number of gate stages in the ring oscillator 305A is six gate stages. Therefore, the frequency M×½ (Hz) of the oscillation output signal 203a is generated from the oscillator 203 (ring oscillator 305A).

Further, for generating the frequency M×⅓ (Hz) of the oscillation output signal 203a from the oscillator 203, the selector 304-1 is controlled to select the D1 path and the selectors 304-2, 304-3 are controlled to select the D2 paths, whereby the number of gate stages in the ring oscillator 305A is nine gate stages.

As discussed above, by providing such selectors for switching the number of gate stages in the loop of the ring oscillator 305A, the ring oscillator 305A may oscillate at the frequency corresponding to the transmission rate of the input data 11 of the PLL circuit. The oscillation output signal 203a of the ring oscillator 305A may be directly compared with the input data 11. As a result, a stable PLL operation in the clock recovery circuit may be carried out, and errorless recovery data may be generated from the semiconductor integrated circuit 30.

In the above descriptions of the first embodiment of the second-type semiconductor integrated circuit 30 shown in FIG. 13, the oscillation frequency M/n (Hz) of the oscillator 203 is controlled to be identical to the transmission rate M/n (bps) of the input data 11.

However, in the semiconductor integrated circuit 30 shown in FIG. 13, regardless of variations of the transmission rate of the input data 11, it is possible for the oscillator 203 to always oscillate at the frequency M (Hz) which corresponds to the receivable maximum transmission rate of the input data 11. In this case, for example, even when the transmission rate M/n of the input data 11 is provided to the clock recovery circuit, and when the oscillator 203 oscillates at the frequency M (Hz), the PLL circuit may operate in a stable condition by properly constituting the phase comparator 201. Such a configuration of the phase comparator 201 is well-known, and, thus, a description of the phase comparator 201 is omitted here.

In the above-discussed case, the oscillation output signal 203a of the oscillator 203 is also directly fed back to the phase comparator 201 without passing through the divider. Therefore, a loop gain in the PLL circuit is prevented from being degraded. As a result, a stable PLL operation in the clock recovery circuit may be carried out, and errorless recovery data may be generated from the semiconductor integrated circuit 30.

Next, descriptions will be given of a second embodiment of the second-type semiconductor integrated circuit according to the present invention.

Figure 17:
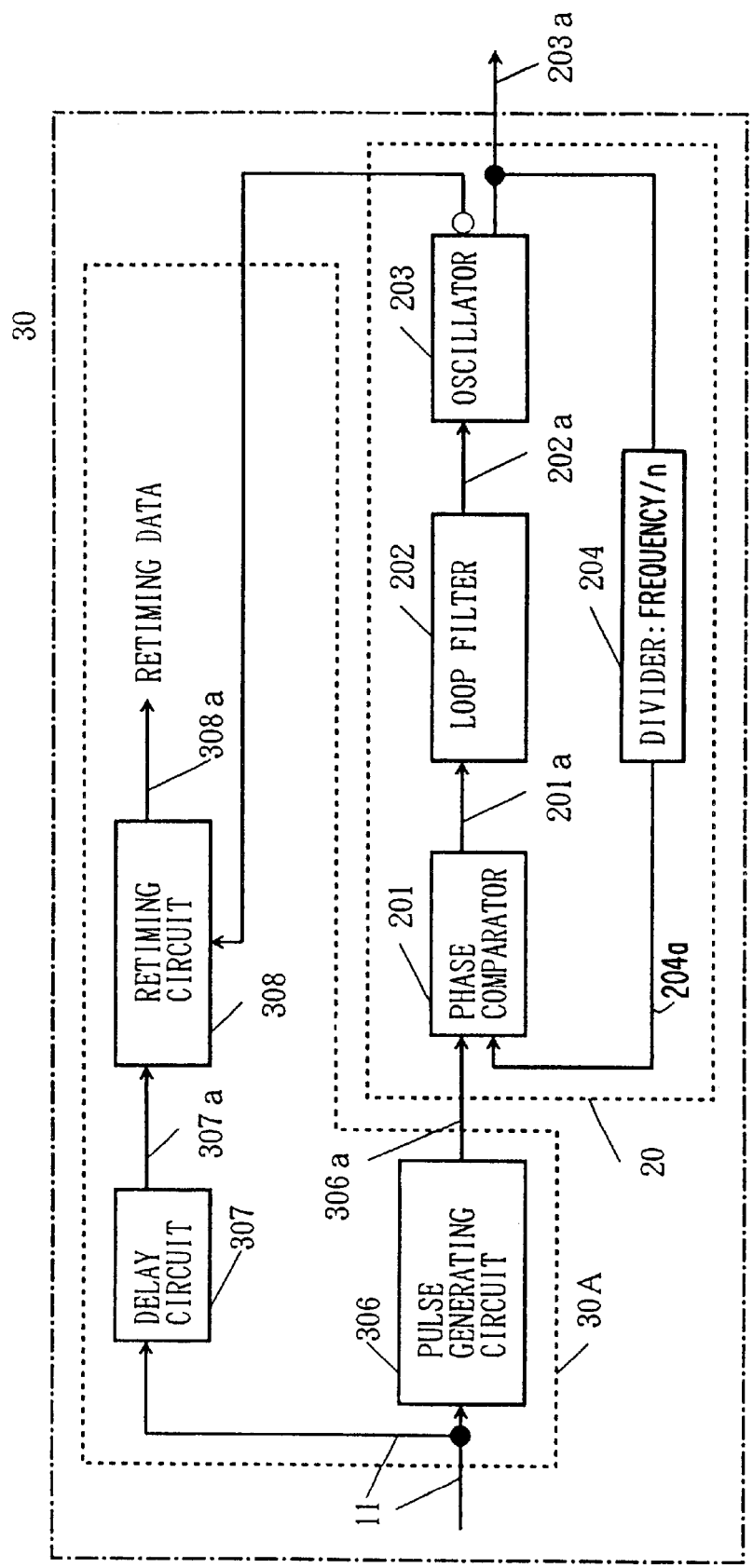
FIG. 17 shows a second embodiment of the second-type semiconductor integrated circuit according to the present invention using a PLL circuit as a clock recovery circuit.
Figure 18:
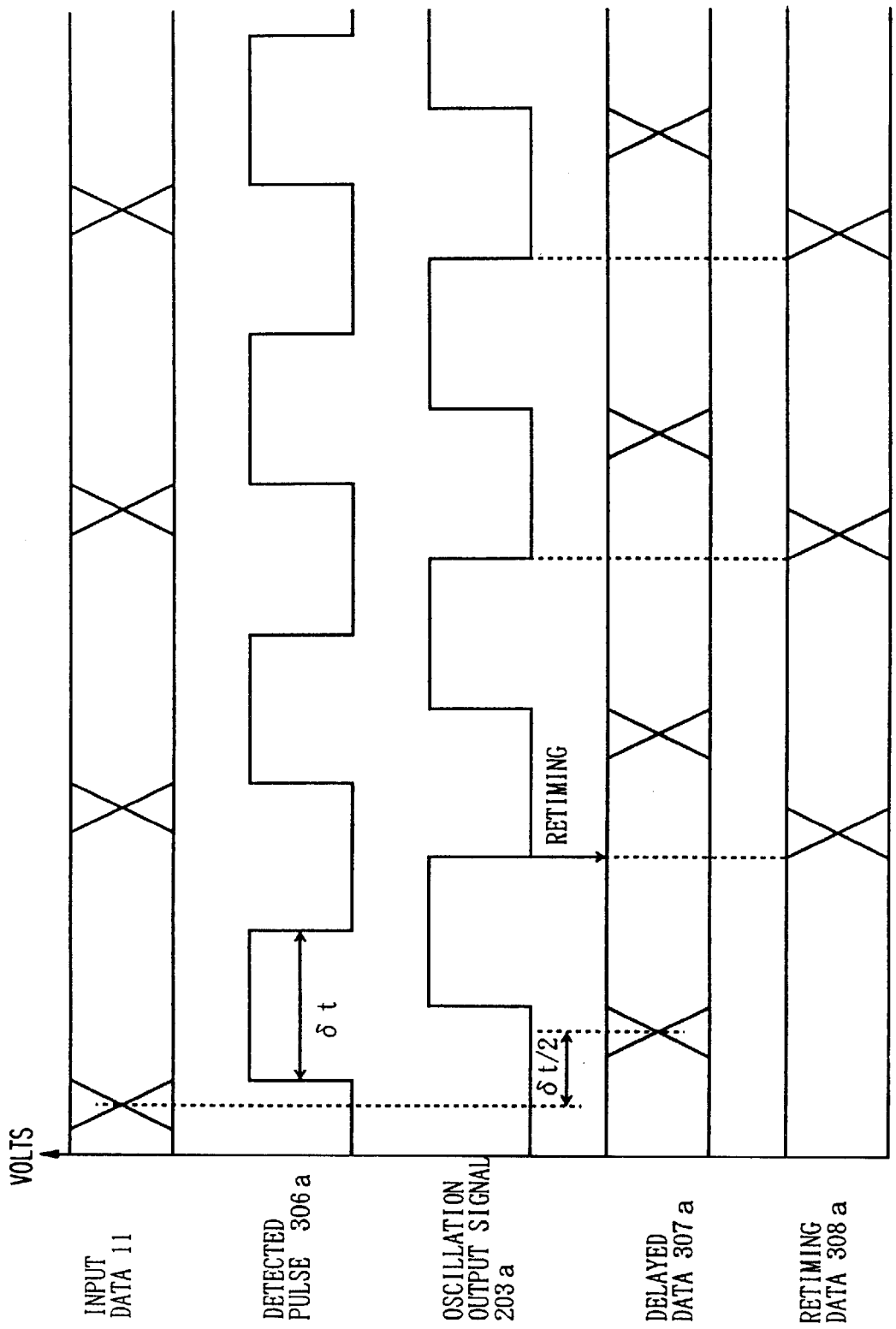
FIG. 18 shows a timing chart of an operation of the second embodiment of the second-type semiconductor integrated circuit shown in FIG. 17.

FIG. 17 shows a second embodiment of the second-type semiconductor integrated circuit according to the present invention using a PLL circuit as a clock recovery circuit. FIG. 18 shows a timing chart of an operation of the second embodiment of the second-type semiconductor integrated circuit shown in FIG. 17. Elements in FIG. 17 which are the same as those of FIG. 13 are given the same reference numerals.

In the second embodiment of the second-type semiconductor integrated circuit 30, as compared to the first embodiment shown in FIG. 13, the divider 204 is provided in the PLL circuit 20. The PLL circuit 20 may operate in the same way as the PLL 20A, 20B shown in FIG. 4. Namely, the oscillation output signal 203a of the oscillator 203 is divided by n (n=1, 2, 3, ...) in the divider 204 to produce the divided signal 204a. The divided signal 204a is compared with a detected pulse 306a generated based on the input data 11 in the phase comparator 201.

The phase comparator 201, the loop filter 202, and the oscillator 203 of the PLL circuit 20 are constructed so that a leading edge or a trailing edge of the oscillation output signal 203a is positioned at substantially the center of the detected pulse 306a.

The retiming block 30A of the second embodiment of the second-type semiconductor integrated circuit 30 is constructed with a pulse generating circuit 306, a delay circuit 307, and a retiming circuit 308. In the retiming block 30A, different from the retiming block 9B shown in FIG. 2, the delay circuit 307 is provided between the input data 11 and the retiming circuit 308. Further, an inverted signal of the oscillation output signal 203a is supplied to the retiming circuit 308 as a retiming clock.

As shown in FIG. 18, the pulse generating circuit 306, in the same way as the pulse generating circuit 5 shown in FIG. 2, detects a transition of the input data 11 and generates the detected pulse 306a having a pulse width δt. The detected pulse 306a is provided to the phase comparator 201 to be compared with the divided signal 204a.

The delay circuit 307, when the leading edge or the trailing edge of the oscillation output signal 203a is controlled to be positioned at substantially the center of the pulse width δt of the detected pulse 306a, delays the input data 11 by a delay time δt/2 and generates delayed data 307a. In this case, as discussed later, the delay time δt/2 may be precisely obtained from the pulse width δt of the detected pulse 306a.

The retiming circuit 308 carries out a retiming operation for the delayed data 307a by the leading edge or the trailing edge of the inverted signal of the oscillation output signal 203a (the trailing edge in the case shown in FIG. 18), and generates retiming data 308a. For the retiming circuit 308, a flip-flop circuit is usable. For example, when a D-type flip-flop circuit is used, the delayed data 307a is applied to a data terminal D of the D-type flip-flop circuit, and the inverted signal of the oscillation output signal 203a is applied to a clock terminal thereof.

In the above-discussed configuration of the semiconductor integrated circuit 30 shown in FIG. 17, when the delay time δt/2 in the delay circuit 307 is changed due to an outside temperature, fluctuation of an operation power source, dispersion due to manufacture, etc., in the same way, the pulse width δt of the detected pulse 306a is also changed.

Further, as discussed previously, the PLL circuit is constructed so that the leading edge or the trailing edge of the oscillation output signal 203a is controlled to be positioned at substantially the center of the pulse width δt of the detected pulse 306a. Therefore, even if the delay time δt/2 in the delay circuit 307 is changed, the leading edge or the trailing edge of the oscillation output signal 203a may be positioned at substantially the center of the pulse width δt of the detected pulse 306a.

Accordingly, as shown in FIG. 18, the leading edge or the trailing edge of the oscillation output signal 203a may be always positioned at substantially the center of the input data 11, even if the delay time in the delay circuit 307 is changed.

As a result, the clock recovery circuit in the semiconductor integrated circuit 30 is prevented from being influenced from outside temperature, fluctuation of an operation power source, dispersion due to manufacture, etc., and errorless recovery data may be generated.

In the following, a description will be given of a configuration example of the pulse generating circuit 306 and the delay circuit 307 in the retiming block 30A.

Figure 19:
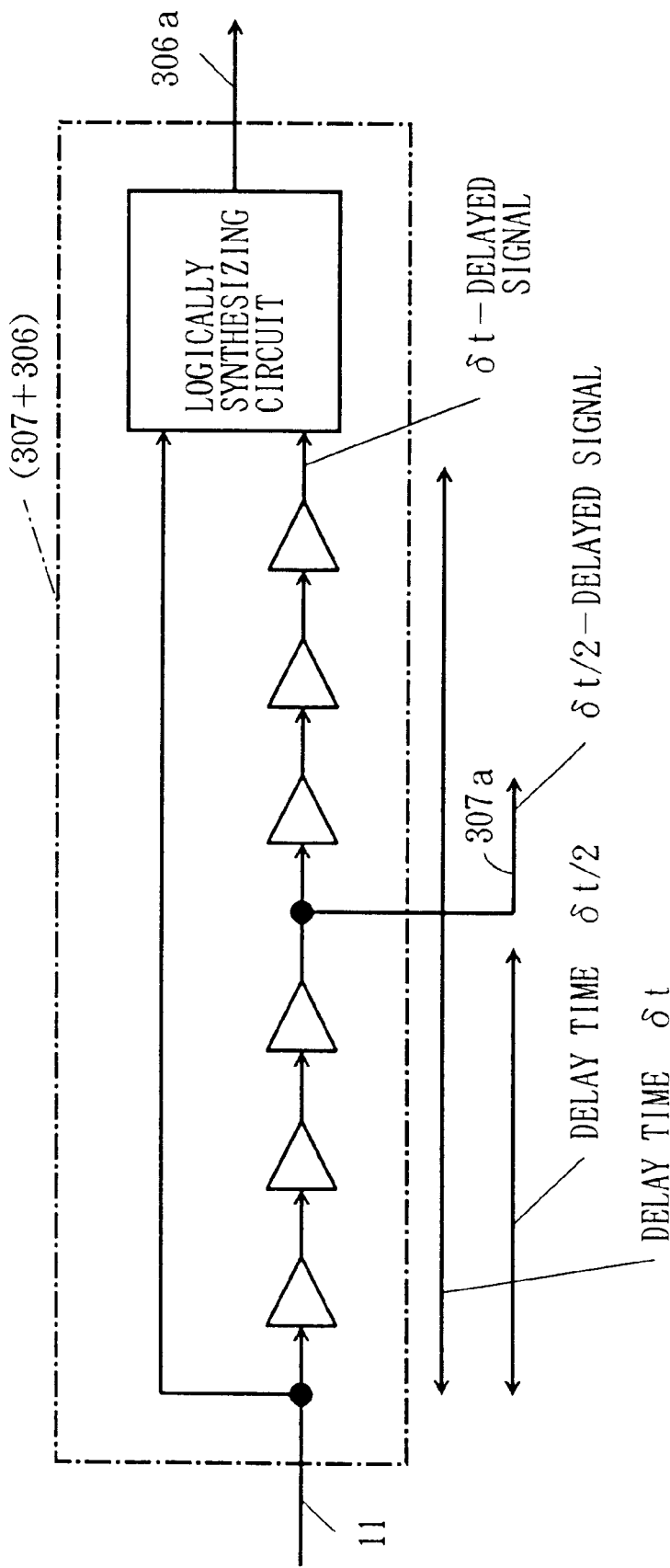
FIG. 19 shows a configuration example of a pulse generating circuit and a delay circuit in a retiming block shown in FIG. 17.

FIG. 19 shows a configuration example of the pulse generating circuit 306 and the delay circuit 307 in the retiming block 30A shown in FIG. 17. FIG. 19 shows a combination circuit of the pulse generating circuit 306 and the delay circuit 307.

In the combination circuit, the pulse generating circuit 306 is constructed with former gate stages (having three buffer gates), latter gate stages (having three buffer gates), and a logically synthesizing circuit. The former gate stages and the latter gate stages are connected in series, and the input data 11 is delayed by a delay time δt through both the gates stages.

The delayed-by-δt input data (δt-delayed signal) and the input data 11 without passing any gates are logically synthesized in the logically synthesized circuit. For the logically synthesized circuit, a variety of logical circuits are usable. For example, when an exclusive OR (EX-OR) circuit is used for the logically synthesized circuit, the detected pulse 306a having the pulse width δt shown in FIG. 18 may be easily obtained as the detected pulse 306a.

Further, in the combination circuit shown in FIG. 19, the delay circuit 307 is constructed with the former buffer gate stages. In a process of manufacturing the semiconductor integrated circuit, it is easy to determine a ratio of the delay times of the former gate stages and the latter gate stages. Therefore, by precisely designing the ratio of the delay times of both gate stages, the delayed-by-δt/2 input data (δt/2-delayed signal) may be precisely obtained as the delayed data 307a.

In this way, the pulse generating circuit 306 and the delay circuit 307 in the retiming block 30A of the semiconductor integrated circuit 30 shown in FIG. 17 may be easily constructed as a combination circuit. Therefore, the clock recovery circuit of the semiconductor integrated circuit 30 may be simplified. Further, the clock recovery circuit in the semiconductor integrated circuit 30 is prevented from being influenced from outside temperature, fluctuation of an operation power source, dispersion due to manufacture, etc., and errorless recovery data may be generated.

In the following, a description will be given of a configuration example of the oscillator 203 in the PLL circuit of the second embodiment of the second-type semiconductor integrated circuit 30 shown in FIG. 17.

Figure 20A:
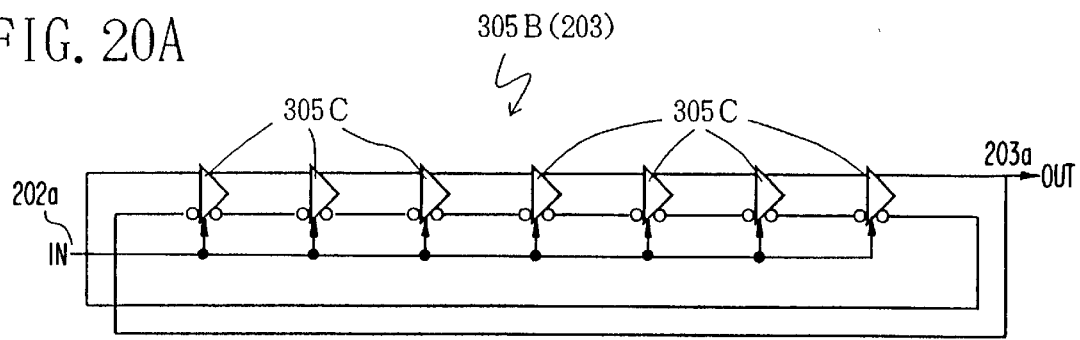
FIG. 20A shows a configuration example of an oscillator in the PLL circuit of the second embodiment of the second-type semiconductor integrated circuit shown in FIG. 17.
Figure 20B:
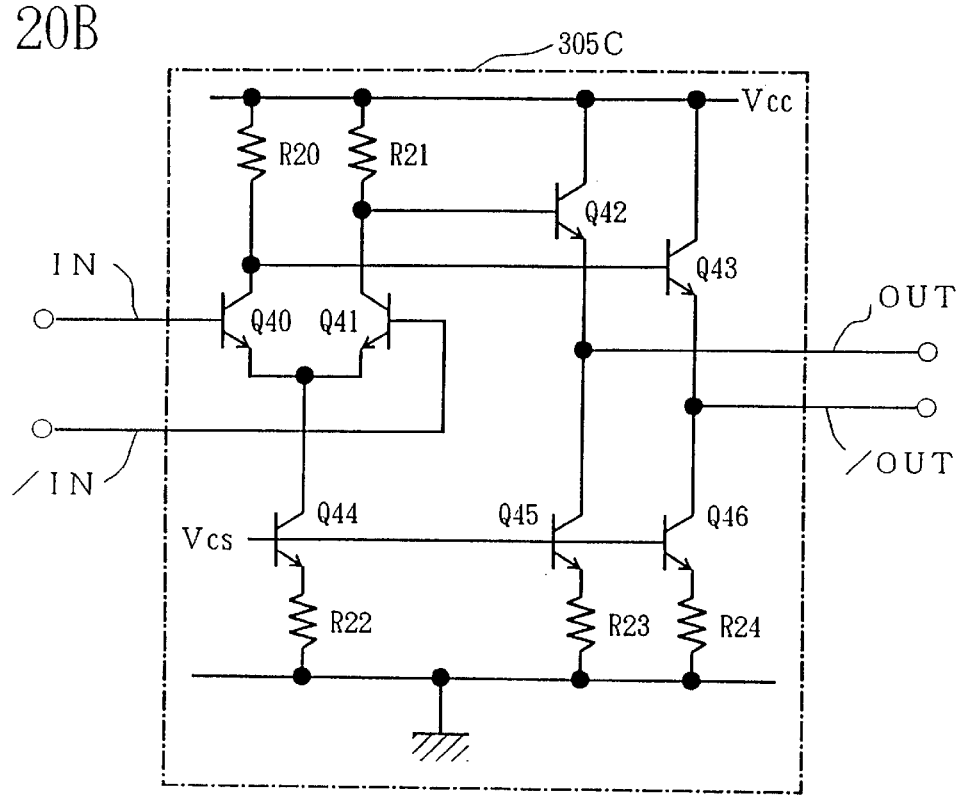
FIG. 20B shows a schematic diagram of one of differential inverter circuits constituting the oscillator shown in FIG. 20A.

FIG. 20A shows a configuration example of the oscillator 203 in the PLL circuit of the second embodiment of the second-type semiconductor integrated circuit 30 shown in FIG. 17. FIG. 20A shows a differential ring oscillator 305B constructed with a plurality of differential circuits 305C. FIG. 20B shows a schematic diagram of one of the differential circuits 305C constituting the differential ring oscillator 305B shown in FIG. 20A.

In general, when the ring oscillator is used, it is important that a duty ratio of an oscillation output of the ring oscillator is controllable. If the duty ratio of the oscillation output is not properly adjusted (not 50%), it becomes difficult to adjust the leading edge or the trailing edge of the inverted signal of the oscillation output signal 203a to substantially the center of the pulse of the input data 11.

In a conventional single-line-type ring oscillator, since signal transition times for rising transition and falling transition are different, the duty ratio of the oscillation output may be easily shifted from 50%. As a result, when the retiming operation is carried out by the inverted signal of the oscillation output signal 203a, the retiming point may be shifted. Further, since the input data 11 has phase fluctuation due to noise, at the worst case, an error occurs in the retiming data 308a.

To resolve the above-discussed problem due to an improper duty ratio, the differential ring oscillator 305B may be applied to the oscillator 203. As discussed in the following, the differential ring oscillator 305B may have the proper duty ratio (substantially 50%).

In FIG. 20B, the differential circuit 305C is constructed with a differential amplifier circuit, a constant-current circuit, and two output circuits. The differential amplifier circuit is constructed with transistors Q40, Q41, and resistors R20, R21 respectively connected to collectors of the transistors Q40, Q41. Differential inputs IN, /IN produced from the former connected differential circuit 305C are respectively provided to bases of the transistors Q40, Q41.

A constant-current circuit operating as a constant-current source is connected to emitters of the transistors Q40, Q41 in the differential amplifier circuit, and is constructed with a transistor Q44 and a resistor R22.

A first output circuit is constructed with transistors Q42, Q45 and a resistor R23 which are connected in series. The first output circuit receives a voltage of a node between the resistor R21 and the transistor Q41, and amplifies the node voltage to produce it to a differential output terminal OUT. A second output circuit is constructed with transistors Q43, Q46 and a resistor R24 which are connected in series. The second output circuit receives a voltage of a node between the resistor R20 and the transistor Q40, and amplifies the node voltage to produce it to a differential output terminal /OUT.

In FIG. 20A, seven differential circuits 305C are connected in series, namely the differential outputs OUT and /OUT of the former differential circuit 305C are respectively connected to the differential inputs IN and /IN of the latter differential circuit 305C. However, the differential outputs OUT and /OUT of the seventh differential circuit 305C (most right side circuit in the drawing) are inversely connected to the differential inputs /IN and IN of the first differential circuit 305C (most left side circuit in the drawing). In this way, the differential ring oscillation may be carried out.

In the differential ring oscillator 305B, a differential voltage between the rising transition and the falling transition may be amplified and transmitted through the ring. Therefore, from the differential ring oscillator 305B, the oscillation output signal 203a having the proper duty ratio (substantially 50%) may be obtained.

Accordingly, the leading edge or the trailing edge of the inverted signal of the oscillation output signal 203a may be precisely adjusted to substantially the center of the detected pulse 306a, and, also may be precisely adjusted to substantially the center of the data pulse of the input data 11.

As a result, regardless of outside temperature, fluctuation of an operation power source, dispersion due to manufacture, etc., the proper duty ratio of the oscillator 203 may be obtained in the PLL clock recovery circuit of the semiconductor integrated circuit 30, and, thus, errorless recovery data may be generated.

Further, the present invention is not limited to these embodiments, but other variations and modifications may be made without departing from the scope of the present invention.

What is claimed is:

1. A semiconductor integrated circuit generating a stabilized oscillation signal based on an input signal, the circuit comprising:

a plurality of unit circuits connected in series, each of said unit circuits having at least an oscillator to output an oscillation output signal, a divider, and a phase comparator which form at least one part of a phase-locked loop; each of said unit circuits being connected such that a frequency of the oscillation output signal of one of said unit circuits is higher than a frequency of the oscillation output signal from a unit circuit directly preceding the one of said unit circuits, the oscillation output signal of the one of said unit circuits being said stabilized oscillation signal, wherein;

each of said unit circuits further comprises a loop filter, the loop filter of the one of the unit circuits having a time constant smaller than that of the loop filter of the directly preceding one of the unit circuits, wherein the loop filter provided in the one of said unit circuits generates an oscillation-frequency control signal having a greater control range of a control voltage than an oscillation-frequency control signal generated from the loop filter in the unit circuit directly preceding the one of said unit circuits, and the oscillator provided in the one of said unit circuits generates said oscillation output signal having a larger variation with respect to said control range of said control voltage than that of said oscillation output signal generated in the unit circuit directly preceding the one of said unit circuits.

2. The semiconductor integrated circuit as claimed in claim 1, further comprising isolating means for electrically isolating said unit circuits from each other so that the unit circuits can be connected in a stable state in which electromagnetic interference between the unit circuits can be suppressed.

3. The semiconductor integrated circuit as claimed in claim 1, further comprising a dedicated power source for each of said u nit circuits.

4. The semiconductor integrated circuit as claimed in claim 1, wherein:

the unit circuit directly preceding the one of said unit circuits further includes a differential output circuit and the one of said unit circuits further includes a differential receive circuit; and said differential output circuit being coupled with an output part of said oscillator in the unit circuit directly preceding the one of said unit circuits, and converts said oscillation output signal from said oscillator of the directly preceding unit circuit into a differential oscillation output signal to be transmitted to the one of said unit circuits; and said differential receive circuit is coupled with an input part of said phase comparator in the one of said unit circuits, and receives said differential oscillation output signal transmitted from said differential output circuit in the unit circuit directly preceding the one of said unit circuits, and converts said differential oscillation output signal into an input signal of said phase comparator of the one of said unit circuits.

5. The semiconductor integrated circuit as claimed in claim 1, wherein said divider provided in at least one of said unit circuits comprises a division ratio less than a ratio of the frequency of said oscillation output signal to a frequency of an input signal of said phase comparator.

6. A semiconductor integrated circuit generating a stabilized oscillation signal based on an input signal, the circuit comprising:

a plurality of unit circuits, all of which are connected directly with the others so as to be in series, each of said unit circuits having at least an oscillator, a divider, and a phase comparator which form at least one part of a phase-locked loop, wherein a frequency of an oscillation output signal from said oscillator of one of said unit circuits has a greater control range of a control voltage than that of an oscillation output signal from said oscillator of a directly preceding one of said unit circuits, and said oscillation output signal of the one of said unit circuits being said stabilized oscillation signal.

* * * * *

UNITED STATES PATENT AND TRADEMARK OFFICE
CERTIFICATE OF CORRECTION

PATENT NO.: 6,118,316
DATED : September 12, 2000
INVENTOR(S): Masaya TAMAMURA et al.

It is certified that error appears in the above-identified patent and that said Letters Patent is hereby corrected as shown below:

Col. 24, line 41, change "u nit" to --unit--;
lines 61-62, delete "of the one of said unit circuits".

Signed and Sealed this

Twenty-fourth Day of April, 2001

Attest:

NICHOLAS P. GODICI

Attesting Officer    Acting Director of the United States Patent and Trademark Office